US010386670B2

(12) United States Patent
Uchida et al.

(10) Patent No.: US 10,386,670 B2
(45) Date of Patent: Aug. 20, 2019

(54) DISPLAY DEVICE

(71) Applicant: Sharp Kabushiki Kaisha, Sakai, Osaka (JP)

(72) Inventors: Seiichi Uchida, Sakai (JP); Kuniaki Okada, Sakai (JP); Naoki Ueda, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/539,888

(22) PCT Filed: Dec. 11, 2015

(86) PCT No.: PCT/JP2015/084786
§ 371 (c)(1),
(2) Date: Jun. 26, 2017

(87) PCT Pub. No.: WO2016/104185
PCT Pub. Date: Jun. 30, 2016

(65) Prior Publication Data
US 2017/0363894 A1 Dec. 21, 2017

(30) Foreign Application Priority Data
Dec. 26, 2014 (JP) ................................. 2014-263862

(51) Int. Cl.
*G02F 1/1335* (2006.01)
*G02F 1/1368* (2006.01)
(Continued)

(52) U.S. Cl.
CPC ...... *G02F 1/133512* (2013.01); *G02F 1/1368* (2013.01); *G02F 1/133514* (2013.01);
(Continued)

(58) Field of Classification Search
CPC ............ G02F 1/1368; G02F 1/133512; G02F 1/133514; G02F 2202/10; G02F 2201/40;
(Continued)

(56) References Cited

U.S. PATENT DOCUMENTS

2003/0020855 A1* 1/2003 Lee ........................ G02B 5/201
349/115
2004/0179160 A1* 9/2004 Rhee ...................... G02F 1/1362
349/139
(Continued)

FOREIGN PATENT DOCUMENTS

JP   2006-126855 A   5/2006
JP   2008-181099 A   8/2008
(Continued)

OTHER PUBLICATIONS

English translation of JP 2012083627 A, Title: Color Filter and Liquid Crystal Display Device, Author: Tezuka Masato; Nishida Tomonori; Kurashige Mihoko; Shirato Makiko; Oshiro Reimi; Ogaki Megumi; Watabe Katsumi; Makimoto Yuji; Yamada Aya; Date of publication: Apr. 26, 2012.*

*Primary Examiner* — Shan Liu
(74) *Attorney, Agent, or Firm* — ScienBiziP, P.C.

(57) ABSTRACT

A first substrate of a display device includes a TFT provided for each pixel and including an oxide semiconductor layer. A second substrate includes a color filter layer and a light blocking layer. At least one of a first, second and third color filter included in the color filter layer has an average transmittance of 0.2% or less for visible light having a wavelength of 450 nm or less. In pixels provided with color filters having an average transmittance of 0.2% or less for visible light having a wavelength of 450 nm or less, the light blocking layer (a) includes a TFT shading portion extending along a channel length direction and having a width that is less than or equal to a length of the oxide semiconductor
(Continued)

layer along a channel width direction; (b) includes a TFT shading portion extending along the channel width direction and having a width that is less than or equal to the length of the oxide semiconductor layer along the channel length direction; or (c) includes no TFT shading portion.

11 Claims, 16 Drawing Sheets

(51) Int. Cl.
  *H01L 27/12* (2006.01)
  *H01L 29/24* (2006.01)
  *H01L 29/786* (2006.01)
  *G02F 1/1362* (2006.01)

(52) U.S. Cl.
  CPC ........ *H01L 27/127* (2013.01); *H01L 27/1225* (2013.01); *H01L 29/24* (2013.01); *H01L 29/7869* (2013.01); *G02F 1/136286* (2013.01); *G02F 2201/123* (2013.01); *G02F 2201/40* (2013.01); *G02F 2202/10* (2013.01)

(58) Field of Classification Search
  CPC ......... G02F 1/136286; G02F 2201/123; G02F 1/136209; G02F 1/13473; G02F 1/133371; G02F 2001/136222; G02F 2001/136218; G02F 1/13439; G02F 1/1362; G02F 1/136227; G02F 1/1365; G02F 2001/136231; G02F 2001/13625; G02F 2001/1635; G02F 2201/122; H01L 29/24; H01L 27/127; H01L 27/1225; H01L 29/7869; H01L 2021/775; H01L 27/1214; H01L 27/2436; H01L 29/66037; H01L 29/66068; H01L 29/66227; H01L 29/72; H01L 29/786; H01L 2924/1304; H01L 51/0504; H01L 51/0508; H01J 11/44; H01J 2211/444; H01J 2329/323; H01J 29/327
  USPC ...................... 349/106–111, 42–43
  See application file for complete search history.

(56) References Cited

U.S. PATENT DOCUMENTS

| | | | | |
|---|---|---|---|---|
| 2006/0227260 A1* | 10/2006 | Haga | ................. | G02F 1/133514 349/61 |
| 2006/0290846 A1* | 12/2006 | Kim | .................... | G02F 1/13362 349/113 |
| 2007/0046650 A1* | 3/2007 | Lee | ..................... | G02F 1/13338 345/173 |
| 2008/0151151 A1* | 6/2008 | Fujikawa | .......... | G02F 1/136227 349/106 |
| 2009/0167996 A1* | 7/2009 | Takahashi | ......... | G02F 1/133512 349/106 |
| 2009/0309821 A1* | 12/2009 | Tanno | ............... | G02F 1/133514 345/87 |
| 2010/0142189 A1* | 6/2010 | Hong | .................. | C09K 11/616 362/97.3 |
| 2011/0042668 A1 | 2/2011 | Hama et al. | | |
| 2012/0138922 A1* | 6/2012 | Yamazaki | ........... | H01L 29/7869 257/43 |
| 2012/0162573 A1* | 6/2012 | Takahashi | ............ | C04B 35/597 349/61 |
| 2012/0206326 A1* | 8/2012 | Nakamura | ............. | G02B 5/201 345/88 |
| 2013/0155356 A1* | 6/2013 | Jang | ..................... | G02F 1/1343 349/106 |
| 2013/0277679 A1* | 10/2013 | Yamazaki | ......... | G02F 1/133305 257/72 |
| 2013/0320334 A1 | 12/2013 | Yamazaki et al. | | |
| 2014/0286076 A1 | 9/2014 | Aoki et al. | | |
| 2015/0234243 A1* | 8/2015 | Oono | ................ | G02F 1/133514 349/106 |
| 2015/0279262 A1* | 10/2015 | Tsai | ..................... | G09G 3/2003 345/88 |
| 2016/0291402 A1* | 10/2016 | Wang | ..................... | H01L 27/32 |

FOREIGN PATENT DOCUMENTS

| | | | |
|---|---|---|---|
| JP | 2011-066375 A | | 3/2011 |
| JP | 2012-083627 A | | 4/2012 |
| JP | 2012083627 A | * | 4/2012 |
| JP | 2012-134475 A | | 7/2012 |
| JP | 2013-218337 A | | 10/2013 |
| JP | 2014-007399 A | | 1/2014 |
| JP | 2014-209727 A | | 11/2014 |

* cited by examiner (a)

(b)

(c)

DISPLAY DEVICE

TECHNICAL FIELD

The present invention relates to a display device, and particularly to a display device having TFTs including an oxide semiconductor layer.

BACKGROUND ART

An active matrix substrate used in a liquid crystal display device, or the like, includes a switching element such as a thin film transistor (hereinafter "TFT") for each pixel. As such a switching element, a TFT using an oxide semiconductor layer as the active layer (hereinafter referred to as an "oxide semiconductor TFT") is known in the art. Patent Document No. 1 discloses a liquid crystal display device using InGaZnO (an oxide composed of indium, gallium and zinc) in the active layer of the TFT.

Oxide semiconductor TFTs are capable of operating faster than amorphous silicon TFTs. Since oxide semiconductor films are formed by a simpler process than polycrystalline silicon films, it can be applied to devices that require large areas. Thus, oxide semiconductor TFTs have had high expectations as high-performance active elements that can be manufactured while suppressing the number of manufacturing steps and the manufacturing cost.

Since an oxide semiconductor has a high mobility, it is possible to realize a level of performance that is greater than or equal to that of a conventional amorphous silicon TFT even when the size is reduced relative to a conventional amorphous silicon TFT. Thus, when an active matrix substrate of a display device is manufactured by using an oxide semiconductor TFT, it is possible to reduce the percentage of the area taken up by the TFT within a pixel, thereby improving the pixel aperture ratio. Thus, is possible to produce bright display even when the amount of light of the backlight is reduced, thereby realizing a low power consumption.

Moreover, since oxide semiconductor TFTs have desirable off-leak characteristics, it is possible to use a mode of operation in which display is produced while reducing the image rewrite frequency. For example, when displaying a still image, they can be operated so that the image data is rewritten once per second. Such a driving scheme is called pause drive or low-frequency drive, and it is possible to significantly reduce the power consumption of the display device.

CITATION LIST

Patent Literature

[Patent Document No. 1] Japanese Laid-Open Patent Publication No. 2012-134475
[Patent Document No. 2] Japanese Laid-Open Patent Publication No. 2011-66375

SUMMARY OF INVENTION

Technical Problem

As described above, although it is possible to improve the aperture ratio when an oxide semiconductor TFT is used, as compared with a case where an amorphous silicon TFT is used, the definition of the display device has recently been further improved, and there is a demand for further improving the aperture ratio.

However, it is difficult for the following reason to further improve the aperture ratio of a display device having oxide semiconductor TFTs.

The TFT characteristics of oxide semiconductor TFTs deteriorate by being irradiated with light (see Patent Document No. 2). Specifically, the threshold voltage shifts negatively. Therefore, with a display device having oxide semiconductor TFTs, a black matrix (light blocking layer), which is provided on the side of the counter substrate (provided so as to oppose the active matrix substrate), includes an area that overlaps with the oxide semiconductor TFT, and the area (the TFT shading portion) shades the oxide semiconductor TFT. The TFT shading portion inhibits further improvement of the aperture ratio.

The present invention, which has been made view of the problems set forth above, has an object to improve the aperture ratio of a display device having oxide semiconductor TFTs.

Solution to Problem

A display device according to an embodiment of the present invention includes: a first substrate, and a second substrate provided so as to oppose the first substrate; and a plurality of pixels arranged in a matrix pattern, wherein: the first substrate includes a TFT provided for each of the plurality of pixels, the TFT including an oxide semiconductor layer including a channel region, a source region and a drain region; the second substrate includes a color filter layer and a light blocking layer; the color filter layer includes a first color filter, a second color filter and a third color filter that allow light of different colors to pass therethrough; at least one of the first color filter, the second color filter and the third color filter has an average transmittance of 0.2% or less for visible light having a wavelength of 450 nm or less; in pixels provided with color filters having an average transmittance of 0.2% or less for visible light having a wavelength of 450 nm or less, the light blocking layer (a) includes a TFT shading portion extending along a channel length direction and shading at least a portion of the TFT, the TFT shading portion having a width that is less than or equal to a length of the oxide semiconductor layer along a channel width direction; or (b) includes a TFT shading portion extending along the channel width direction and shading at least a portion of the TFT, the TFT shading portion having a width that is less than or equal to the length of the oxide semiconductor layer along the channel length direction; or (c) includes no TFT shading portion that shades at least a portion of the TFT.

In one embodiment, the plurality of pixels include a red pixel displaying red, a green pixel displaying green, and a blue pixel displaying blue; and the first color filter, the second color filter and the third color filter are a red color filter that allows red light to pass therethrough, a green color filter that allows green light to pass therethrough, and a blue color filter that allows blue light to pass therethrough, respectively.

In one embodiment, at least one of the red color filter and the green color filter has an average transmittance of 0.2% or less for visible light having a wavelength of 450 nm or less.

In one embodiment, the blue color filter has an average transmittance greater than 0.2% for visible light having a wavelength of 450 nm or less; and in the blue pixel, the light blocking layer includes a TFT shading portion extending along the channel length direction and shading the TFT, the TFT shading portion having a width that is greater than the length of the oxide semiconductor layer along the channel width direction.

In one embodiment, the red color filter and the green color filter each have an average transmittance of 0.2% or less for visible light having a wavelength of 450 nm or less; and in each of the red pixel and the green pixel, the light blocking layer either includes a TFT shading portion extending along the channel length direction, shading at least a portion of the TFT and having a width that is less than or equal to the length of the oxide semiconductor layer along the channel width direction or does not include a TFT shading portion shading at least a portion of the TFT.

In one embodiment, the blue color filter has an average transmittance greater than 0.2% for visible light having a wavelength of 450 nm or less; and in the blue pixel, the light blocking layer includes a TFT shading portion extending along the channel width direction and shading the TFT, the TFT shading portion having a width that is greater than the length of the oxide semiconductor layer along the channel length direction.

In one embodiment, the red color filter and the green color filter each have an average transmittance of 0.2% or less for visible light having a wavelength of 450 nm or less; and in each of the red pixel and the green pixel, the light blocking layer either includes a TFT shading portion extending along the channel width direction, shading at least a portion of the TFT and having a width that is less than or equal to the length of the oxide semiconductor layer along the channel length direction or does not include a TFT shading portion shading at least a portion of the TFT.

In one embodiment, in each of the red pixel and the green pixel, the light blocking layer includes the TFT shading portion; and a width of the TFT shading portion in the red pixel is equal to a width of the TFT shading portion in the green pixel.

In one embodiment, in each of the red pixel and the green pixel, the light blocking layer includes the TFT shading portion; and a width of the TFT shading portion in the red pixel is smaller than a width of the TFT shading portion in the green pixel.

In one embodiment, in each of the red pixel and the green pixel, the light blocking layer includes the TFT shading portion; and a width of the TFT shading portion in the green pixel is smaller than a width of the TFT shading portion in the red pixel.

Alternatively, a display device according to an embodiment of the present invention includes: a first substrate, and a second substrate provided so as to oppose the first substrate; and a plurality of pixels arranged in a matrix pattern, wherein: the first substrate includes a TFT provided for each of the plurality of pixels, the TFT including an oxide semiconductor layer, and a color filter layer; the plurality of pixels include a first pixel displaying a first color, a second pixel displaying a second color different from the first color, and a third pixel displaying a third color different from the first color and the second color; the color filter layer includes a first color filter that allows light of the first color to pass therethrough, a second color filter that allows light of the second color to pass therethrough, and a third color filter that allows light of the third color to pass therethrough; the first color filter and the second color filter each have an average transmittance of 0.2% or less for visible light having a wavelength of 450 nm or less; the first color filter is arranged so as to overlap with the TFT provided in the first pixel; and the second color filter is arranged so as to overlap with the TFT provided in the second pixel.

In one embodiment, the first pixel, the second pixel and the third pixel are a red pixel displaying red, a green pixel displaying green, and a blue pixel displaying blue, respectively; the first color filter, the second color filter and the third color filter are a red color filter that allows red light to pass therethrough, a green color filter that allows green light to pass therethrough, and a blue color filter that allows blue light to pass therethrough, respectively; the red color filter is arranged so as to overlap with the TFT provided in the red pixel; the green color filter is arranged so as to overlap with the TFT provided in the green pixel; and at least one of the red color filter and the green color filter is arranged so as to overlap also with the TFT provided in the blue pixel.

In one embodiment, the oxide semiconductor layer includes an In—Ga—Zn—O-based semiconductor.

In one embodiment, the In—Ga—Zn—O-based semiconductor includes a crystalline portion.

In one embodiment, the display device of the present invention further includes a liquid crystal layer provided between the first substrate and the second substrate.

Advantageous Effects of Invention

According to an embodiment of the present invention, it is possible to improve the aperture ratio of a display device having oxide semiconductor TFTs.

DESCRIPTION OF EMBODIMENTS

Embodiments of the present invention will now be described with reference to the drawings. Note that the present invention is not limited to the following embodiments.

Embodiment 1

Figure 1:
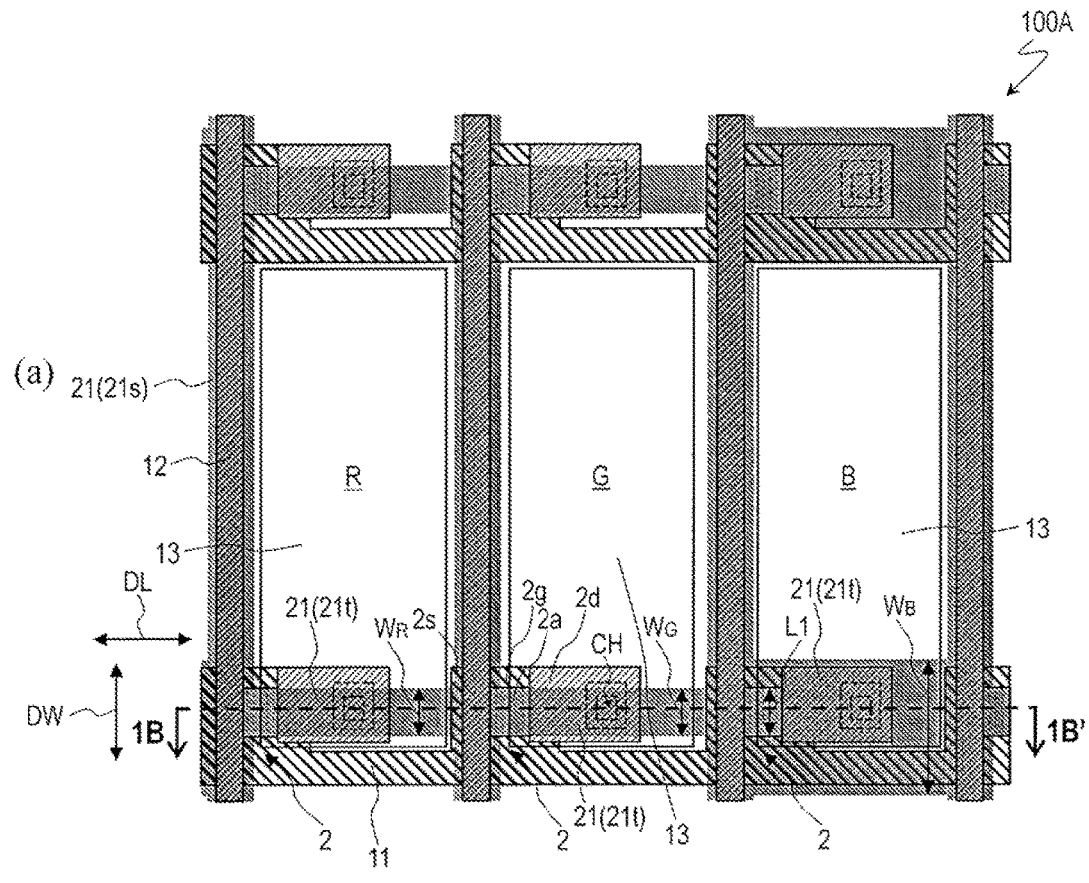
FIG. 1 (a) is a plan view schematically showing a liquid crystal display device 100A according an embodiment of the present invention, and (b) is a cross-sectional view taken along line 1B-1B' of (a).
Figure 1:
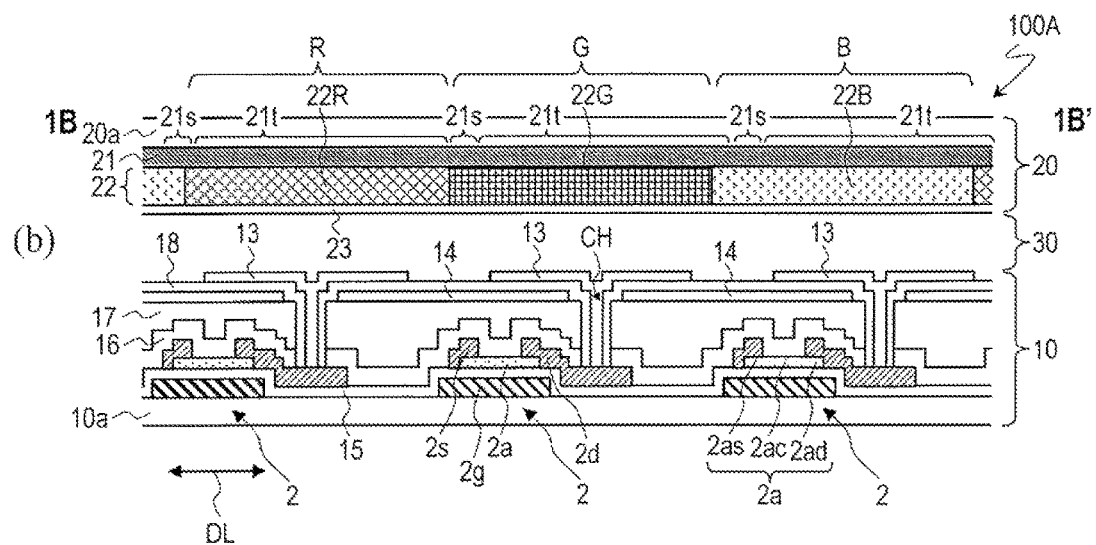

FIGS. 1(a) and 1(b) show the liquid crystal display device 100A of the present embodiment. FIG. 1(a) is a plan view schematically showing the liquid crystal display device 100A, and FIG. 1(b) is a cross-sectional view taken along line 1B-1B' of FIG. 1(a).

As shown in FIGS. 1(b), the liquid crystal display device 100A includes a TFT substrate (first substrate) 10, a counter substrate (second substrate) 20 provided so as to oppose the TFT substrate 10, and a liquid crystal layer 30 provided between the TFT substrate 10 and the counter substrate 20. The liquid crystal display device 100A also includes a plurality of pixels arranged in a matrix pattern. In the present embodiment, the plurality of pixels of the liquid crystal display device 100A include red pixels R displaying red, green pixels G displaying green, and blue pixels B displaying blue.

As shown in FIGS. 1(a) and 1(b), the TFT substrate 10 includes a TFT (thin film transistor) 2 provided in each of the plurality of pixels, a plurality of scanning lines (gate bus lines) 11 extending in the row direction, and a plurality of signal lines (source bus lines) 12 extending in the column direction. The TFT substrate 10 includes a pixel electrode 13 provided in each of the plurality of pixels, and a storage capacitor counter electrode 14 provided so as to oppose the pixel electrode 13.

The TFT 2 includes an oxide semiconductor layer 2a, a gate electrode 2g, a source electrode 2s and a drain electrode 2d. The gate electrode 2g is electrically connected to a scanning line 11, and receives a scanning signal voltage supplied from the scanning line 11. In the present embodiment, a portion of the scanning line 11 is formed with a wider width than other portions thereof, and this portion functions as the gate electrode 2g. The source electrode 2s is electrically connected to a signal line 12, and receives a display signal voltage supplied from the signal line 12. In the present embodiment, a portion of the signal line 12 overlaps with the oxide semiconductor layer 2a, and this portion functions as the source electrode 2s. The drain electrode 2d is electrically connected to the pixel electrode 13.

A region 2as of the oxide semiconductor layer 2a that is in contact with the source electrode 2s is referred to as the "source region", and a region 2ad thereof that is in contact with the drain electrode 2d is referred to as the "drain region". A region 2ac of the oxide semiconductor layer 2a that overlaps with the gate electrode 2g and that is located between the source region 2as and the drain region 2ad is referred to as the "channel region". Thus, the oxide semiconductor layer 2a includes the channel region 2ac, the source region 2as and the drain region 2ad. In the present embodiment, in a plane parallel to the substrate surface, a direction DL that is parallel to the direction in which the current flows through the channel region 2ac is referred to as the "channel length direction", and a direction DW that is perpendicular to the channel length direction is referred to as the "channel width direction". In the present embodiment, the channel length direction DL is parallel to the row direction (i.e., the channel width direction DW is parallel to the column direction), and the source region 2as, the channel region 2ac and the drain region 2ad are arranged along the row direction. In the present embodiment, such an arrangement of the TFT 2 is referred to as the "horizontal arrangement".

The above-mentioned components of the TFT substrate 10 are supported on an insulative transparent substrate 10a. The gate electrode 2g and the scanning line 11 are provided on a surface of the transparent substrate 10a that is on the side of the liquid crystal layer 30, and a gate insulating layer 15 is provided so as to cover the gate electrode 2g and the scanning line 11.

The oxide semiconductor layer 2a, the source electrode 2s, the drain electrode 2d and the signal line 12 are provided on the gate insulating layer 15. The source electrode 2s is formed so as to be in contact with the upper surface of the source region 2as of the oxide semiconductor layer 2a, and the drain electrode 2d is formed so as to be in contact with the drain region 2ad of the oxide semiconductor layer 2a.

An inorganic insulating layer 16 is provided so as to cover the oxide semiconductor layer 2a, the source electrode 2s, the drain electrode 2d and the signal line 12. An organic insulating layer 17 is provided on the inorganic insulating layer 16.

The storage capacitor counter electrode 14 is provided on the organic insulating layer 17. A dielectric layer 18 is provided so as to cover the storage capacitor counter electrode 14. The pixel electrode 13 is provided on the dielectric layer 18. The pixel electrode 13 is connected to the drain electrode 2d through the contact hole CH formed in the inorganic insulating layer 16, the organic insulating layer 17 and the dielectric layer 18. The pixel electrode 13, the storage capacitor counter electrode 14 and the dielectric layer 18 located therebetween together form a storage capacitor.

The counter substrate 20 includes a light blocking layer (black matrix) 21, a color filter layer 22 and a counter electrode 23.

The light blocking layer 21 includes a first portion 21s that overlaps with the signal line 12, and a second portion 21t that overlaps with at least a portion of the TFT 2. The first portion 21s extends along the column direction, whereas the second portion 21t extends along the row direction (i.e., along the channel length direction DL). The second portion 21t, which shades at least a portion of the TFT 2, is referred to as the "TFT shading portion".

The color filter layer 22 includes three kinds of color filters that allow light of different colors to pass therethrough. Specifically, the color filter layer 22 includes a red color filter 22R that allows red light to pass therethrough, a green color filter 22G that allows green light to pass therethrough, and a blue color filter 22B that allows blue light to pass therethrough.

The counter electrode 23 is provided so as to oppose the pixel electrode 13. Typically, the counter electrode 23 is a single conductive film (i.e., a common electrode) that is continuous across all the pixels.

The above-mentioned components of the counter substrate 20 are supported on an insulative transparent substrate 20a.

A pair of alignment films (not shown) are provided on a surface of the TFT substrate 10 and a surface of the counter substrate 20 that are on the side of the liquid crystal layer 30. In the present embodiment, since the display mode is a VA (Vertical Alignment) mode, the pair of alignment films are each a vertical alignment film.

In the liquid crystal display device 100A of the present embodiment, the blue color filter 22B has an average transmittance greater than 0.2% for visible light having a wavelength 450 nm or less. In contrast, the red color filter 22R and the green color filter 22G each have an average transmittance of 0.2% or less for visible light having a wavelength of 450 nm or less.

As shown in FIG. 1(a), the TFT shading portion 21t of the light blocking layer 21 in the blue pixel B has a width $W_B$ that is greater than the length L1 of the oxide semiconductor layer 2a along the channel width direction DW. In contrast, the TFT shading portion 21t in the red pixel R and that in the green pixel G have widths $W_R$ and $W_G$ respectively, which are less than or equal to the length L1 of the oxide semiconductor layer 2a along the channel width direction DW. Herein, the width $W_R$ of the TFT shading portion 21t in the red pixel R is equal to the width $W_G$ of the TFT shading portion 21t in the green pixel G.

As described above, in the present embodiment, the red color filter 22R and the green color filter 22G have an average transmittance of 0.2% or less for visible light having a wavelength of 450 nm or less, and the widths $W_R$ and $W_G$ of the TFT shading portion 21t in the red pixel R and that of the green pixel G are less than or equal to the length L1 of the oxide semiconductor layer 2a along the channel width direction DW.

The liquid crystal display device 100A of the present embodiment can be manufactured as follows, for example.

Figure 2:
FIG. 2(a) to (c) are cross-sectional views of process steps schematically showing a method for producing a counter substrate 20 of the liquid crystal display device 100A.
Figure 2:
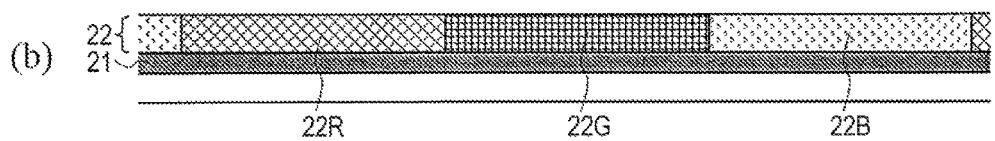
Figure 2:
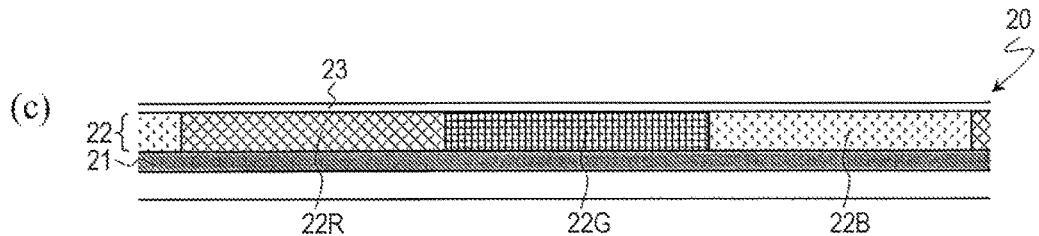

First, referring to FIG. 2(a) to (c), a method for manufacturing the counter substrate 20 will be described. FIGS. 2(a) to 2(c) are cross-sectional views of process steps schematically showing a method for producing the counter substrate 20.

First, as shown in FIG. 2(a), a light blocking film is deposited on the transparent substrate (e.g., glass substrate) 20a, and the light blocking film is patterned into a desired shape by a photolithography process, thereby forming the light blocking layer 21 including the first portion 21s and the second portion (TFT shading portion) 21t. The light blocking layer 21 is a Ti layer having a thickness of 200 nm, for example. Note that the material of the light blocking layer 21 is not limited to the metal materials illustrated herein, but may be a black photosensitive resin material, for example.

Then, as shown in FIG. 2(b), the red color filter 22R, the green color filter 22G and the blue color filter 22B are formed successively in regions corresponding to the red pixel R, the green pixel G and the blue pixel B, thereby forming the color filter layer 22. The materials of the red color filter 22R, the green color filter 22G and the blue color filter 22B may be, for example, colored photosensitive resin materials.

Then, as shown FIG. 2(c), a transparent conductive film is deposited by a sputtering method on the color filter layer 22, thereby forming the counter electrode 23. The counter electrode 23 is an ITO layer having a thickness 100 nm, for example. Then, an alignment film is formed on the counter electrode 23, thereby obtaining the counter substrate 20.

Then, referring to FIGS. 3(a) to 3(e) and FIGS. 4(a) to 4(d), a method for producing the TFT substrate 10 will be described. FIGS. 3(a) to 3(e) and FIGS. 4(a) to 4(d) are cross-sectional views of process steps schematically showing a method for producing the TFT substrate 10.

Figure 3:
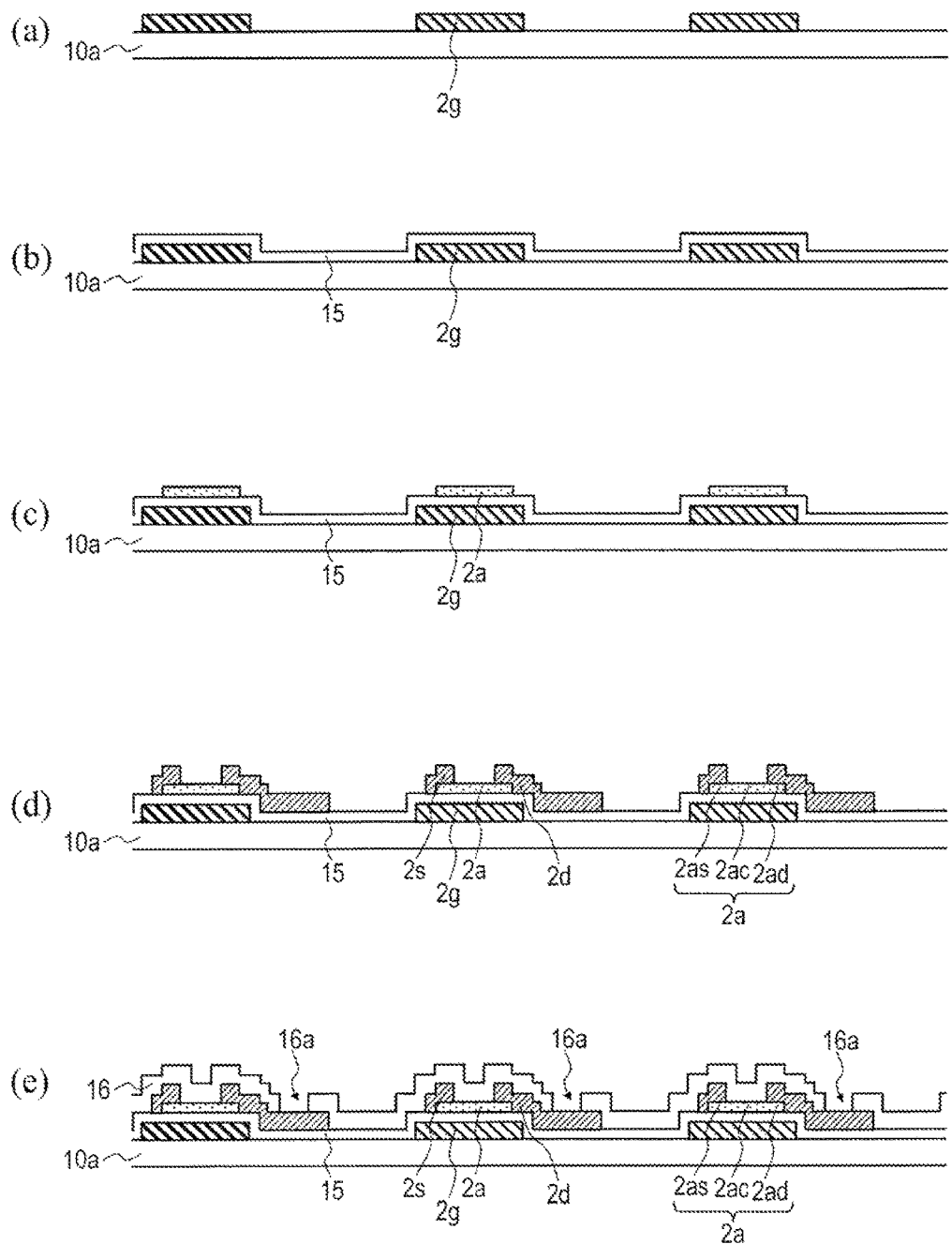
FIG. 3(a) to (e) are cross-sectional views of process steps schematically showing a method for producing a TFT substrate 10 of the liquid crystal display device 100A.

First, as shown in FIG. 3(a), a conductive film is deposited on a transparent substrate (e.g., glass substrate) 10a, and the conductive film is patterned into a desired shape by a photolithography process, thereby forming the gate electrode 2g and the scanning line 11. The gate electrode 2g and the scanning line 11 have a layered structure including a TaN layer having a thickness of 30 nm and a W layer having a thickness of 300 nm layered in this order, for example.

Then, as shown in FIG. 3(b), the gate insulating layer 15 is formed so as to cover the gate electrode 2g and the scanning line 11. The gate insulating layer 15 has a layered structure including an SiNx layer having a thickness of 325 nm and an $SiO_2$ layer having a thickness of 50 nm layered in this order, for example.

Then, as shown in FIG. 3(c), an oxide semiconductor film is deposited on the gate insulating layer 15, and the oxide semiconductor film is patterned into a desired shape by a photolithography process, thereby forming the oxide semiconductor layer 2a. The oxide semiconductor layer 2a is an In—Ga—Zn—O-based semiconductor layer having a thickness of 50 nm, for example.

Then, as shown in FIG. 3(d), a conductive film is deposited, and the conductive film is patterned into a desired shape by a photolithography process, thereby forming the source electrode 2s, the drain electrode 2d and the signal line 12. The source electrode 2s, the drain electrode 2d and the signal line 12 have a layered structure including a Ti layer having a thickness of 30 nm, an Al layer having a thickness of 200 nm and a Ti layer having a thickness of 100 nm layered in this order, for example.

Then, as shown in FIG. 3(e), the inorganic insulating layer 16 is formed so as to cover the oxide semiconductor layer 2a, the source electrode 2s, the drain electrode 2d, etc. The inorganic insulating layer 16 is an $SiO_2$ layer having a thickness of 300 nm, for example. An opening 16a is formed in region of the inorganic insulating layer 16 that is later to be the contact hole CH.

Figure 4:
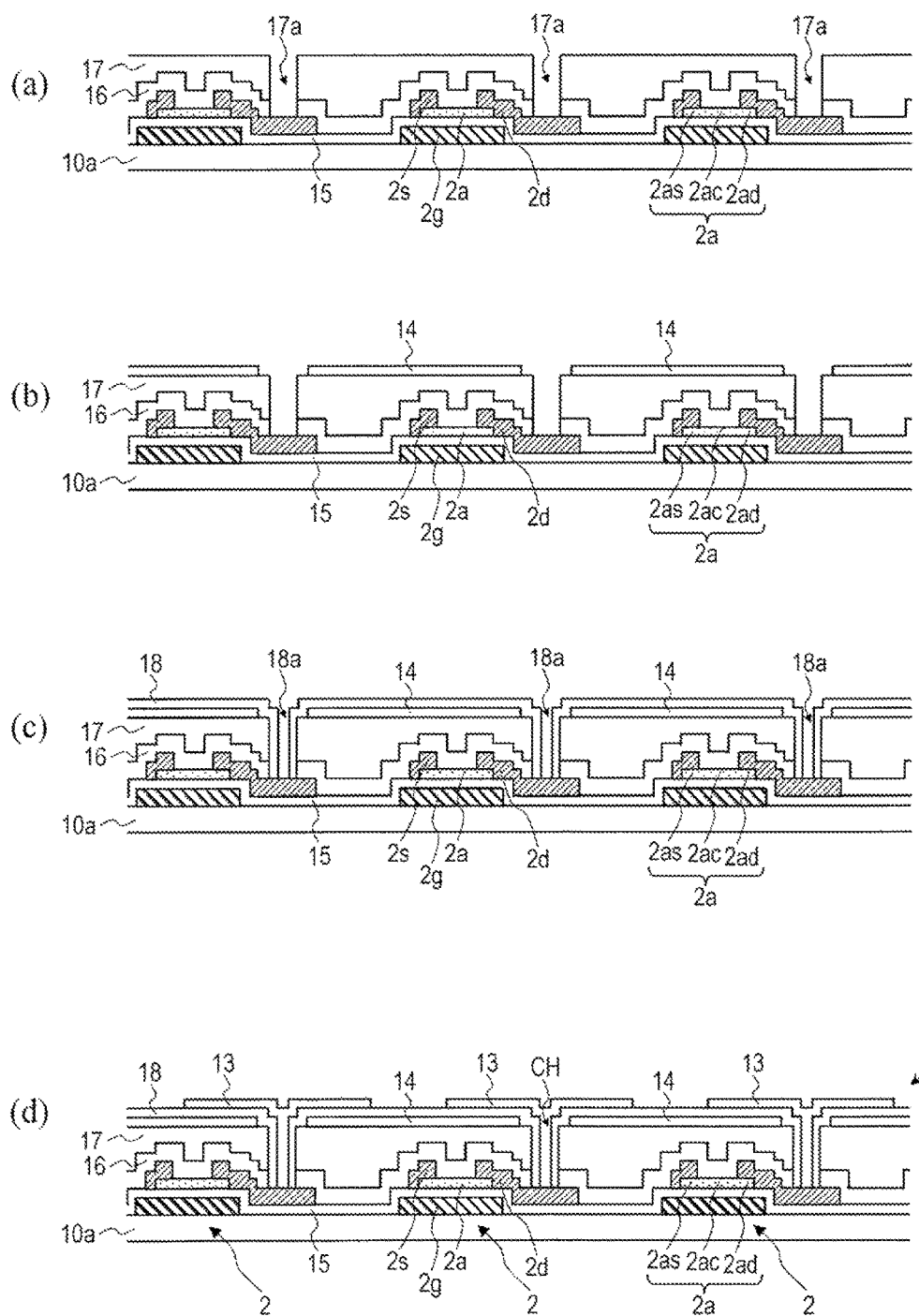
FIG. 4(a) to (d) are cross-sectional views of process steps schematically showing the method for producing the TFT substrate 10 of the liquid crystal display device 100A.

Then, as shown in FIG. 4(a), the organic insulating layer 17 is formed on the inorganic insulating layer 16 for the purpose of planarization. The organic insulating layer 17 is formed from a photosensitive resin, for example. An opening 17a is formed in a region of the organic insulating layer 17 that is later to be the contact hole CH.

Then, as shown FIG. 4(b), a transparent conductive film is deposited on the organic insulating layer 17, and the transparent conductive film is patterned into a desired shape by a photolithography process, thereby forming the storage capacitor counter electrode 14. The storage capacitor counter electrode 14 is an IZO layer having a thickness of 100 nm, for example.

Then, as shown in FIG. 4(c), the dielectric layer 18 is formed so as to cover the storage capacitor counter electrode 14. The dielectric layer 18 is an SiN layer having a thickness of 100 nm, for example. An opening 18a is formed in a region of the dielectric layer 18 that is later to be the contact hole CH.

Then, as shown in FIG. 4(d), a transparent conductive film is deposited on the dielectric layer 18, and the transparent conductive film is patterned into a desired shape by a photolithography process, thereby forming the pixel electrode 13. The pixel electrode 13 is an IZO layer having a thickness of 100 nm, for example. Then, after columnar spacers (photo spacers) are formed at desired positions, an alignment film is formed across the entire surface, thereby obtaining the TFT substrate 10.

The TFT substrate 10 and the counter substrate 20, which have been produced as described above, are attached together, and a liquid crystal material is injected into the gap therebetween, thereby forming the liquid crystal layer 30. Then, the obtained structure is severed into individual panels, thus obtaining complete liquid crystal display devices 100A.

With the liquid crystal display device 100A of the embodiment of the present invention, is possible to improve the aperture ratio, relative to a conventional liquid crystal display device having oxide semiconductor TFTs. The reason for this will be discussed below.

As already described above, when an oxide semiconductor TFT is irradiated with light, the threshold voltage shifts negatively. Such deterioration of TFT characteristics is due to visible light having a wavelength of 450 nm or less. Therefore, when the red color filter 22R and the green color filter 22G have an average transmittance of 0.2% or less for visible light having a wavelength of 450 nm or less, as in the present embodiment, it is possible to sufficiently suppress the deterioration of TFT characteristics (the negative shift of the threshold voltage) even if the widths $W_R$ and $W_G$ of the TFT shading portions 21t in the red pixel R and the green pixel G are made narrower than those in the prior art (specifically, less than or equal to the length L1 along the channel width direction DW of the oxide semiconductor layer 2a). Therefore, it is possible to improve the aperture ratio without detracting from the reliability of the TFT 2, which is an oxide semiconductor TFT.

Figure 5:
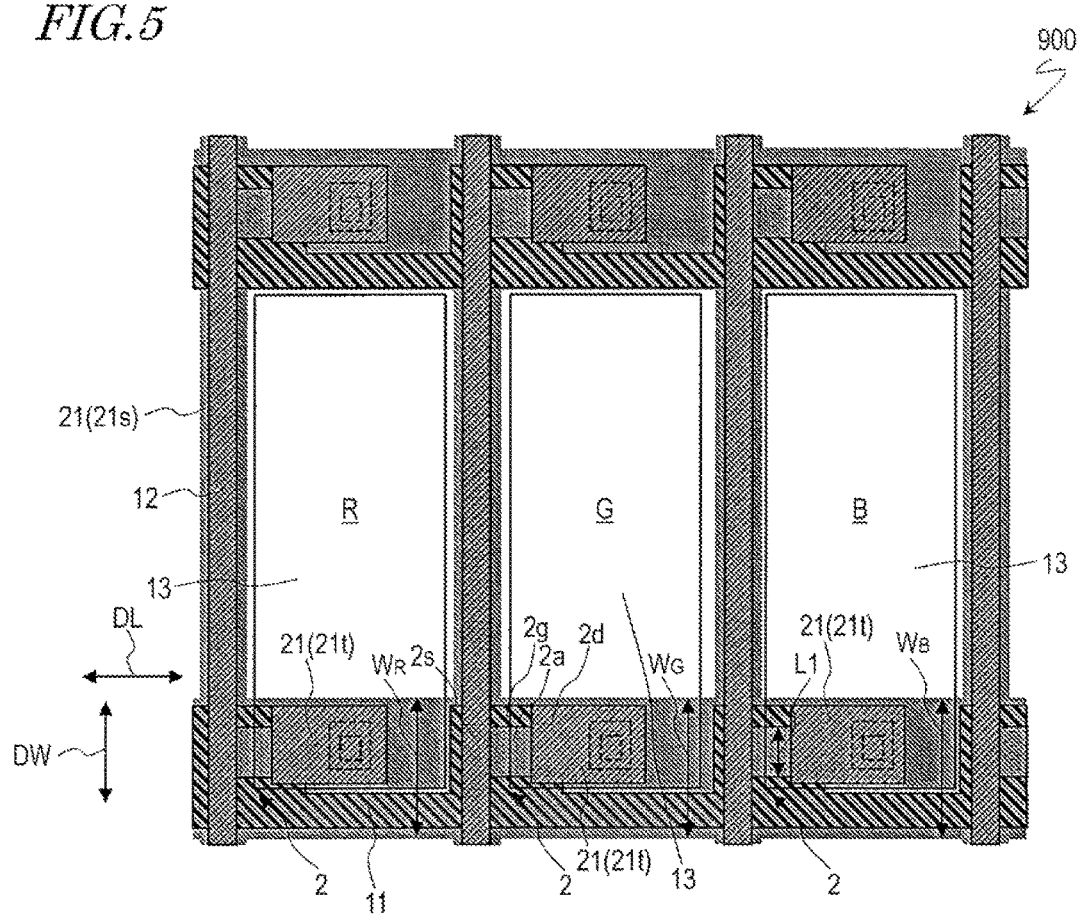
FIG. 5 A plan view schematically showing a liquid crystal display device 900 of a reference example.

FIG. 5 shows a liquid crystal display device 900 of a reference example. The liquid crystal display device 900 of the reference example is different from the liquid crystal display device 100A in that the red color filter and the green color filter (not shown) have an average transmittance greater than 0.2% for visible light having a wavelength of 450 nm or less. The liquid crystal display device 900 of the reference example is also different from the liquid crystal display device 100A in that the widths $W_R$ and $W_G$ of the TFT shading portions 21t in the red pixel R and the green pixel G are greater than the length L1 of the oxide semiconductor layer 2a along the channel width direction DW (equal to the width $W_B$ of the TFT shading portion 21t in the blue pixel B).

With the liquid crystal display device 900 of the reference example shown in FIG. 5, since the red color filter and the green color filter have an average transmittance greater than 0.2% for visible light having a wavelength of 450 nm or less, in order to suppress the negative shift of the threshold voltage due to the TFT 2 being irradiated with visible light, there is a need to set the widths $W_R$ and $W_G$ of the TFT shading portions 21t in the red pixel R and the green pixel G to be sufficiently large (specifically, to be greater than the length L1 of the oxide semiconductor layer 2a along the channel width direction DW). Therefore, the aperture ratio will decrease.

In contrast, with the liquid crystal display device 100A of the present embodiment, the widths $W_R$ and $W_G$ of the TFT shading portions 21t in the red pixel R and the green pixel G can be set to be narrower than those of the liquid crystal display device 900 of the reference example (specifically, to be less than or equal to the length L1 of the oxide semiconductor layer 2a along the channel width direction DW), and it is therefore possible to improve the aperture ratio.

The effect of improving the aperture ratio was estimated for a pixel pitch of 21 µm (a resolution of 403 ppi), indicating that the aperture ratio of the liquid crystal display device 900 of the reference example was 56% whereas the aperture ratio of the liquid crystal display device 100A of the present embodiment was 61%. That the embodiment of the present invention improved the aperture ratio by about 9% as compared with the prior art.

A test was conducted to determine whether it is possible suppress the deterioration of TFT characteristics (the negative shift of the threshold voltage) by setting the average transmittance of the red color filter 22R and the green color filter 22G for visible light having a wavelength of 450 nm or less to be 0.2% or less, and the results of the test will be discussed below.

The test was conducted by evaluating the reliability of an actual prototype (a panel P1) of the liquid crystal display device 100A of the present embodiment and that of another panel (a panel P2) that had substantially the same elements as those of the liquid crystal display device 100A except that the light blocking layer 21 was omitted, while the panels in operation were put in a thermostat.

Figure 6:
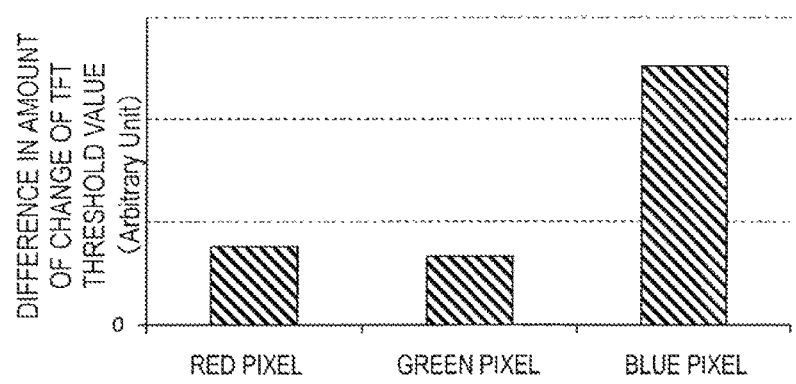
FIG. 6 A graph showing the difference between the amount of change in the threshold voltage of a TFT of a panel P1 and the amount of change in the threshold voltage of a TFT of a panel P2 after 1000 hours since the panels P1 and P2 for reliability evaluation are put in a thermostat.

The inside of the thermostat was kept dry at 70° C., and the panel P1 and the panel P2 placed in the thermostat were irradiated with LED light having an illuminance of 3000 lux from the front surface of the panels. FIG. 6 shows the difference between the amount of change in the threshold voltage of a TFT of the panel P1 and the amount of change in the threshold voltage of a TFT of the panel P2 after 1000 hours since the panels are put in a thermostat. FIG. 6 shows the difference in the amount of change of the threshold voltage for each of the red pixel, the green pixel and the blue pixel.

As can be seen from FIG. 6, for the blue pixel, there is a large difference in the amount of change of the threshold voltage between a TFT of the panel P1 and a TFT of the panel P2. In contrast, for the red pixel and the green pixel, there is a small difference in the amount of change of the threshold voltage between a TFT of the panel P1 and a TFT of the panel P2. This indicates that the lowering of the reliability of the TFT 2 is suppressed even without the light blocking layer 21, if the average transmittance of the red color filter 22R and the green color filter 22G for visible light having a wavelength of 450 nm or less is set to be 0.2% or less.

Note that in order to set the average transmittance of the red color filter 22R and the green color filter 22G for visible light having a wavelength of 450 nm or less to be 0.2% or less, the material of the red color filter 22R and that of the green color filter 22G can be selected appropriately. There is no particular limitation on the material of the red color filter 22R and the material of the green color filter 22G, as long as the average transmittance for visible light having a wavelength of 450 nm or less is 0.2% or less. For the red color filter 22R, the average transmittance for visible light having a wavelength of 450 nm or less can be set to be 0.2% or less by adjusting the transmission characteristic by using a yellow-type pigment (i.e., by adding a yellow-type pigment) in addition to a red-type pigment as the pigment contained in the photosensitive resin, for example. For the green color filter 22G, the average transmittance for visible light having a wavelength of 450 nm or less can be set to be 0.2% or less by adjusting the transmission characteristic by using a yellow-type pigment (i.e., by adding a yellow-type pigment) in addition to a green-type pigment as the pigment contained in the photosensitive resin, for example.

<Regarding Oxide Semiconductor>

The oxide semiconductor included in the oxide semiconductor layer 2a may be an amorphous oxide semiconductor or a crystalline oxide semiconductor having a crystalline portion. Examples of the crystalline oxide semiconductor include a Polycrystalline oxide semiconductor, a microcrystalline oxide semiconductor, a crystalline oxide semiconductor whose c-axis is oriented generally vertical to the layer surface.

The oxide semiconductor layer 2a may have a layered structure of two or more layers. When the oxide semiconductor layer 2a has a layered structure, the oxide semiconductor layer 2a may include an amorphous oxide semiconductor layer and a crystalline oxide semiconductor layer. Alternatively, it may include a plurality of crystalline oxide semiconductor layers having different crystalline structures. When the oxide semiconductor layer 2a has a 2-layer structure including an upper layer and a lower layer, the energy gap of the oxide semiconductor included in the upper layer is preferably greater than the energy gap of the oxide semiconductor included in the lower layer. Note however that when the energy gap difference between these layers is relatively small, the energy gap of the oxide semiconductor of the lower layer may be greater than the energy gap of the oxide semiconductor of the upper layer.

The material, the structure and the deposition method of the amorphous oxide semiconductor, those of the crystalline oxide semiconductors described above, and the structure of the oxide semiconductor layer having a layered structure, etc., are described in Japanese Laid-Open Patent Publication No. 2014-007399, for example. The entire disclosure of Japanese Laid-Open Patent Publication No. 2014-007399 is herein incorporated by reference.

The oxide semiconductor layer 2a may include at least one metal element from among In, Ga and Zn, for example. In the present embodiment, the oxide semiconductor layer 2a includes an In—Ga—Zn—O-based semiconductor, for example. Herein, the In—Ga—Zn—O-based semiconductor is a ternary oxide of in (indium), Ga (gallium) and Zn (zinc), and there is no particular limitation on the ratio (composition ratio) between in, Ga and Zn, e.g., In:Ga:Zn=2:2:1, In:Ga:Zn=1:1:1, In:Ga:Zn=1:1:2, etc. Such an oxide semiconductor layer 2a may be formed from an oxide semiconductor film including an In—Ga—Zn—O-based semiconductor. Note that a channel-etched-type TFT having an active layer including an In—Ga—Zn—O-based semiconductor may be referred to as a "CE-InGaZnO-TFT".

The In—Ga—Zn—O-based semiconductor may be amorphous or crystalline. The crystalline In—Ga—Zn—O-based semiconductor is preferably a crystalline In—Ga—Zn—O-based semiconductor whose c-axis is oriented generally vertical to the layer surface, etc.

Note that the crystalline structure of the crystalline In—Ga—Zn—O-based semiconductor is disclosed for example in Japanese Laid-Open Patent Publication No. 2014-007399, Japanese Laid-Open Patent Publication No. 2012-134475, Japanese Laid-Open Patent Publication No. 2014-209727, etc., mentioned above. The entire disclosures of Japanese Laid-Open Patent Publication No. 2012-134475 and Japanese Laid-Open Patent Publication No. 2014-209727 are herein incorporated by reference. A TFT including an In—Ga—Zn—O-based semiconductor layer, which has a high mobility (greater than 20 times that of an a-Si TFT) and a lower leak current (less than 1/100 that of an a-Si TFT), can suitably be used as a driver TFT and a pixel TFT.

The oxide semiconductor layer 2a may include any other oxide semiconductor instead of an In—Ga—Zn—O-based semiconductor. For example, it may include an In—Sn—Zn—O-based semiconductor (e.g., $In_2O_3$—$SnO_2$—ZnO). The In—Sn—Zn—O-based semiconductor is a ternary oxide of In (indium), Sn (tin) and Zn (zinc). Alternatively, the oxide semiconductor layer 2a may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), an Mg—Zn—O-based semiconductor, an In—Ga—Sn—O-based semiconductor, an In—Ga—O-based semiconductor, a Zr—In—Zn—O-based semiconductor, an Hf—In—Zn—O-based semiconductor, etc.

Note that the TFT 2, which is an oxide semiconductor TFT, may be a "channel-etched-type TFT" or may be an "etch-stop-type TFT".

With a "channel-etched-type TFT", the etch-stop layer is not formed on the channel region, and the channel-side end portions of the source and drain electrodes are arranged so as to be in contact with the upper surface of the oxide semiconductor layer. A channel-etched-type TFT is formed for example by forming a source-drain electrode conductive film on an oxide semiconductor layer and the performing a source-drain separation. In the source-drain separation step, a surface portion of the channel region may be etched.

On the other hand, with a TFT (etch-stop-type TFT) including an etch-stop layer formed on the channel region, the channel-side end portions of the source and drain electrodes are located over the etch-stop layer, for example. An etch-stop-type TFT is formed for example by forming an etch-stop layer covering a portion of the oxide semiconductor layer that is to be the channel region, then forming a source-drain electrode conductive film on the oxide semiconductor layer and the etch-stop layer, and performing a source-drain separation.

Embodiment 2

Figure 7:
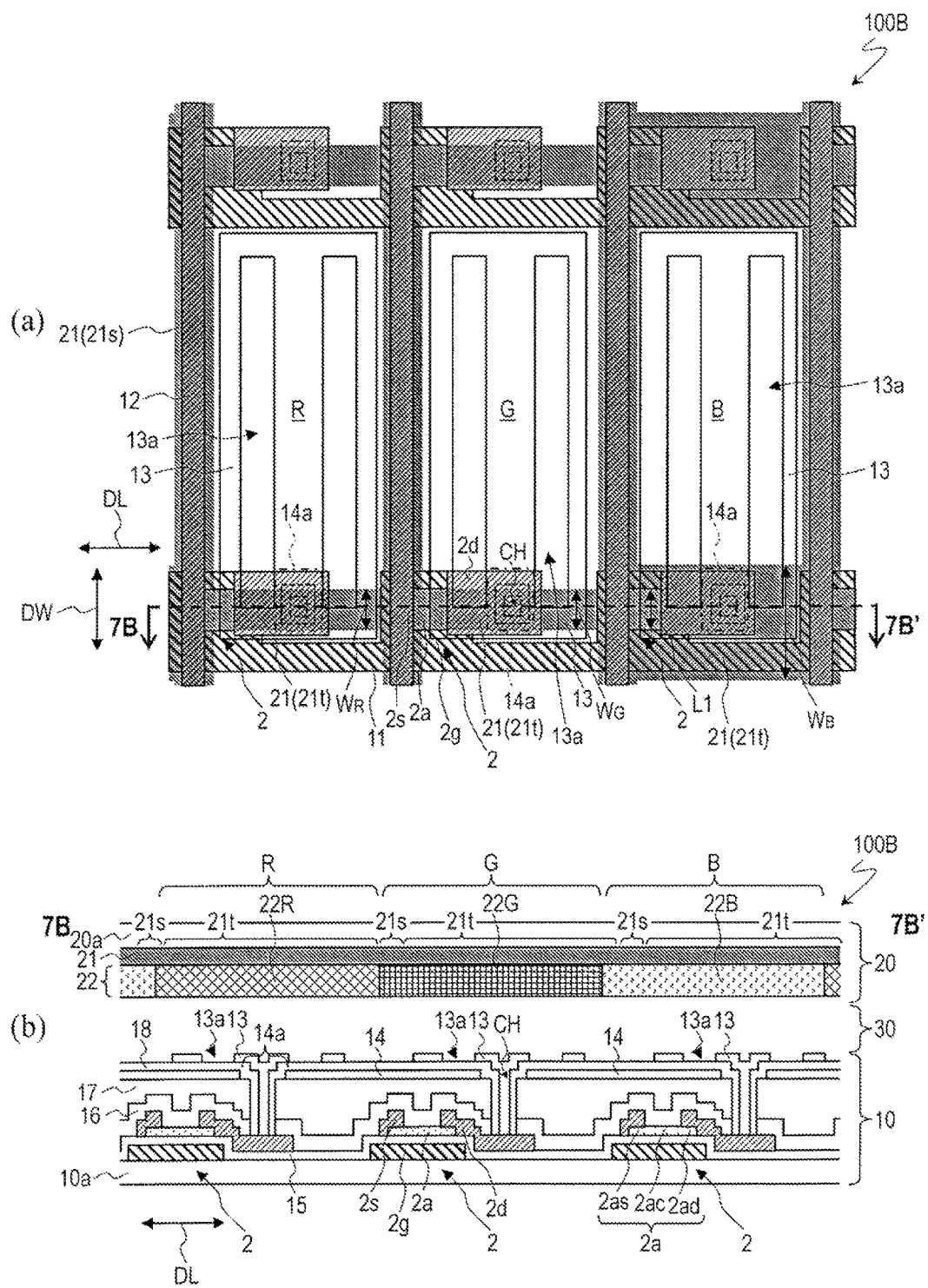
FIG. 7(a) is a plan view schematically showing a liquid crystal display device 100B according to an embodiment of the present invention, and (b) is a cross-sectional view taken along line 7B-7B' of (a).

FIGS. 7(a) and 7(b) show a liquid crystal display device 100B of the present embodiment. FIG. 7(a) is a plan view schematically showing the liquid crystal display device 100B, and FIG. 7(b) is a cross-sectional view taken along line 7B-7B' of FIG. 7(a). The description below will focus on differences between the liquid crystal display device 100B of the present embodiment and the liquid crystal display device 100A of Embodiment 1.

The display mode of the liquid crystal display device 100A of Embodiment 1 is a VA mode, whereas the display mode of the liquid crystal display device 100B of the present embodiment is an FFS (Fringe Field Switching) mode.

With the liquid crystal display device 100B, the pixel electrode 13 includes at least one (herein, two) slits 13a as shown in FIGS. 7(a) and 7(b). The storage capacitor counter electrode 14 functions also as a common electrode, and a fringe electric field is generated based on the potential difference between the pixel electrode 13 and the common electrode 14. No counter electrode is provided on the counter substrate 20. A pair of alignment films (not shown) provided on a surface of the TFT substrate 10 and a surface of the counter substrate 20 that are on the side of the liquid crystal layer 30 are each a horizontal alignment film.

Also in the present embodiment, the red color filter 22R and the green color filter 22G have an average transmittance of 0.2% or less for visible light having a wavelength of 450 nm or less, and the widths $W_R$ and $W_G$ of the TFT shading portions 21t in the red pixel R and the green pixel G are less than or equal to the length L1 of the oxide semiconductor layer 2a along the channel width direction DW. Therefore, also with the liquid crystal display device 100B of the present embodiment, as with the liquid crystal display device 100A of Embodiment 1, it is possible to improve the aperture ratio.

Note that in the example illustrated in FIGS. 7(a) and 7(b), the conductive film of the common electrode 14 is removed only in a region 14a (indicated by a chain line in FIG. 7(a)) around the contact hole CH. That is, the common electrode 14 is formed so as to overlap with the scanning line 11 and the TFT 2.

In pixels (herein, the red pixel R and the green pixel G) where the TFT shading portion 21t is relatively narrow, the electric field of the scanning line 11 and the TFT 2 may leak upward to disturb the orientation of the liquid crystal layer 30, thereby resulting in light leakage. With the common electrode 14 overlapping with the scanning line 11 and the TFT 2, as illustrated in FIGS. 7(a) and 7(b), it is possible to electrically block the electric field of the scanning line 11 and the TFT 2 by means of the common electrode 14, thereby preventing such light leakage described above.

Embodiment 3

Figure 8:
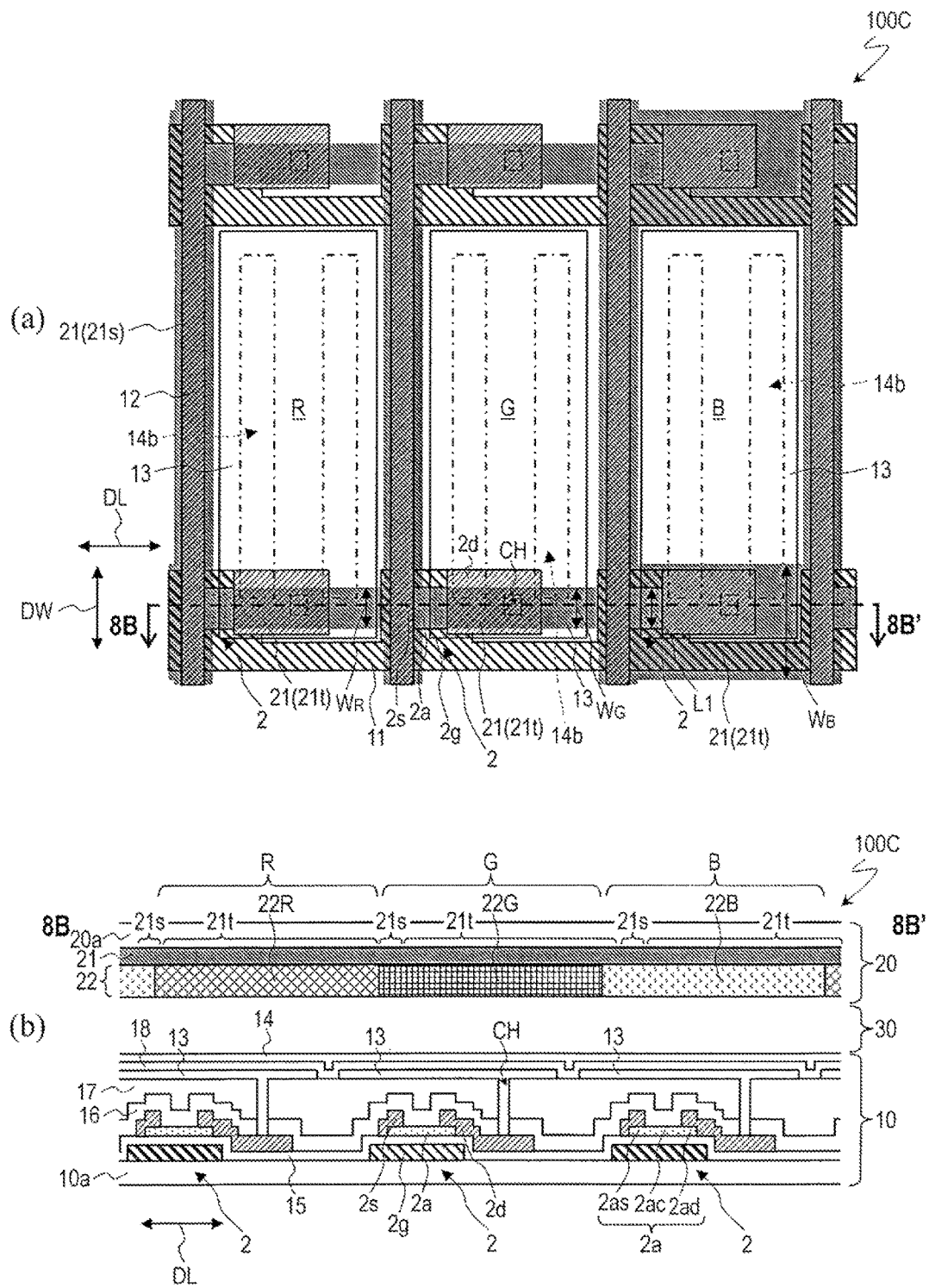
FIG. 8(a) is a plan view schematically showing a liquid crystal display device 100C according to an embodiment of the present invention, and (b) is a cross-sectional view taken along line 8B-8B' of (a).

FIGS. 8(a) and 8(b) show a liquid crystal display device 100C of the present embodiment. FIG. 8(a) is a plan view schematically showing the liquid crystal display device 100C, and FIG. 8(b) is a cross-sectional view taken along line 8B-8B' of FIG. 8(a). The description below will focus on differences between the liquid crystal display device 100C of the present embodiment and the liquid crystal display device 100B of Embodiment 2.

The display mode of the liquid crystal display device 100C of the present embodiment is an FFS mode, as is the display mode of the liquid crystal display device 100B of Embodiment 2.

Note however that while the pixel electrode 13 is located relatively on the upper side and the common electrode 14 relatively on the lower side in the liquid crystal display device 100B of Embodiment 2, the pixel electrode 13 is located relatively on the lower side and the common electrode 14 relatively on the upper side in the liquid crystal display device 100C of the present embodiment as shown in FIGS. 8(a) and 8(b).

In the present embodiment, the pixel electrode 13 is provided on the organic insulating layer 17, and the dielectric layer 18 is provided so as to cover the pixel electrode 13. The common electrode 14 is formed on the dielectric layer 18. The pixel electrode 13 includes no slit, and the common electrode 14 includes at least one (herein, two) slits 14b as shown in FIG. 8(a).

Although the liquid crystal display device 100C of the present embodiment and the liquid crystal display device 100B of Embodiment 2 are different from each other in terms of the relative positional relationship between the pixel electrode 13 and the common electrode 14, as described above, needless to say, the liquid crystal display device 100C of the present embodiment is capable of producing display in an FFS mode with no problem.

Also in the present embodiment, the red color filter 22R and the green color filter 22G have an average transmittance of 0.2% or less for visible light having a wavelength of 450 nm or less, and the widths $W_R$ and $W_G$ of the TFT shading portions 21t in the red pixel R and the green pixel G are less than or equal to the length L1 of the oxide semiconductor layer 2a along the channel width direction DW. Therefore, also with the liquid crystal display device 100C of the present embodiment, as with the liquid crystal display device 100B of Embodiment 2, it is possible to improve the aperture ratio.

Note that in the example shown in FIGS. 8(a) and 8(b), the pixel electrode 13 and/or the common electrode 14 are formed so as to overlap with the scanning line 11 and the TFT 2 as seen from a direction normal to the display surface. Thus, it is possible to electrically block the electric field of the scanning line 11 and the TFT 2 by means of the pixel electrode 13 and/or the common electrode 14, and it is therefore possible to prevent light leakage from occurring in pixels (herein, the red pixel R and the green pixel G) where the TFT shading portion 21t is relatively narrow.

Embodiment 4

Figure 9:
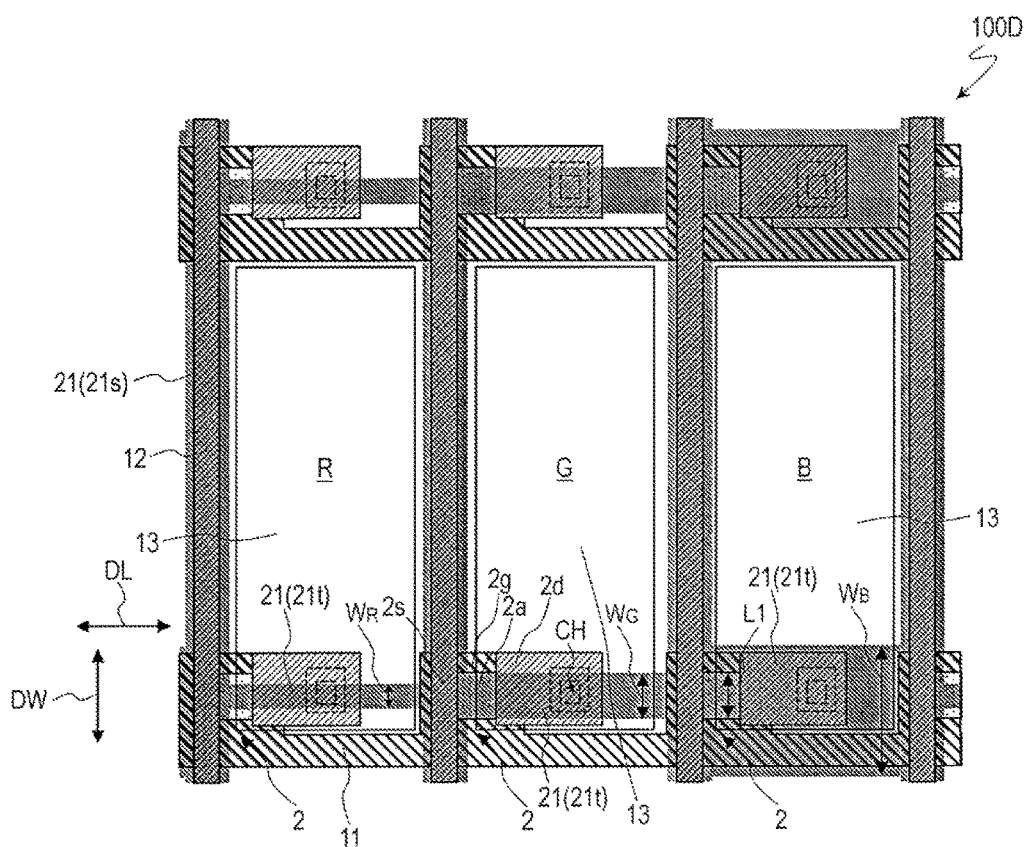
FIG. 9 A plan view schematically showing a liquid crystal display device 100D according to an embodiment of the present invention.
Figure 10:
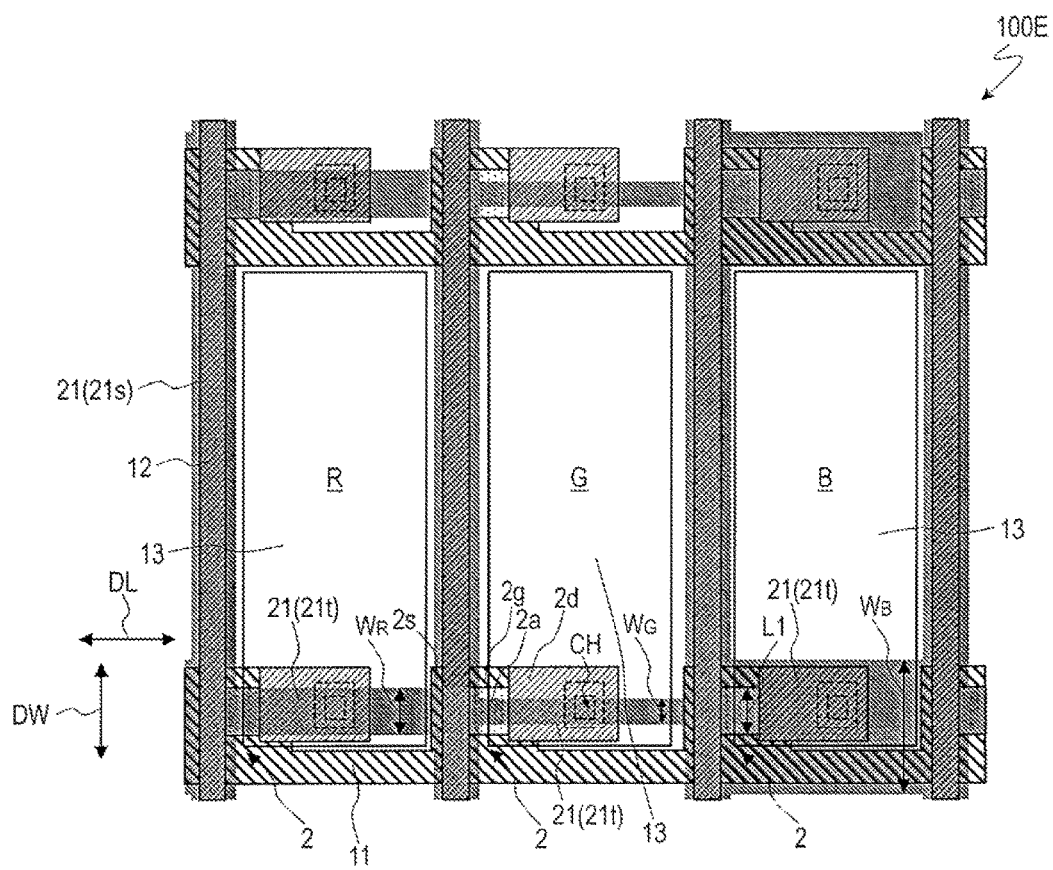
FIG. 10 A plan view schematically showing a liquid crystal display device 100E according to an embodiment of the present invention.

FIG. 9 and FIG. 10 show liquid crystal display devices 100D and 100E of the present embodiment. FIG. 9 is a plan view schematically showing the liquid crystal display device 100D, and FIG. 10 is a plan view schematically showing the liquid crystal display device 100E. The description below will focus on differences between the liquid crystal display devices 100D and 100E of the present embodiment and the liquid crystal display device 100A of Embodiment 1.

In the liquid crystal display device 100A of Embodiment 1, the width $W_R$ of the TFT shading portion 21t in the red pixel R is equal to the width $W_G$ of the TFT shading portion 21t in the green pixel G ($W_R = W_G \leq L1 < W_B$). In contrast, in the liquid crystal display devices 100D and 100E of the present embodiment, the width $W_R$ of the TFT shading portion 21t in the red pixel R is different from the width $W_G$ of the TFT shading portion 21t in the green pixel G as shown in FIG. 9 and FIG. 10. Specifically, in the liquid crystal display device 100D shown in FIG. 9, the width $W_R$ of the TFT shading portion 21t in the red pixel R is smaller than the width $W_G$ of the TFT shading portion 21t in the green pixel G ($W_R < W_G \leq L1 < W_B$), and in the liquid crystal display device 100E shown in FIG. 10, the width $W_G$ of the TFT shading portion 21t in the green pixel G is smaller than the width $W_R$ of the TFT shading portion 21t in the red pixel R ($W_G < W_R \leq L1 < W_B$).

Thus, the width $W_R$ of the TFT shading portion 21t in the red pixel R and the width $W_G$ of the TFT shading portion 21t in the green pixel G may be equal to each other as in the liquid crystal display device 100A of Embodiment 1 or may be different from each other as in the liquid crystal display devices 100D and 100E of the present embodiment. A configuration in which the width $W_R$ of the TFT shading portion 21t in the red pixel R is smaller than the width $W_G$ of the TFT shading portion 21t in the green pixel G, as in the liquid crystal display device 100D shown in FIG. 9, has an advantage that the aperture ratio is further improved by the amount by which the former width $W_R$ is made smaller than the latter width $W_G$. A configuration in which the width $W_G$ of the TFT shading portion 21t in the green pixel G is smaller than the width $W_R$ of the TFT shading portion 21t in the red pixel R, as in the liquid crystal display device 100E shown in FIG. 10, has an advantage that the aperture ratio is further improved by the amount by which the former width $W_G$ is made smaller than the latter width $W_R$.

Figure 11:
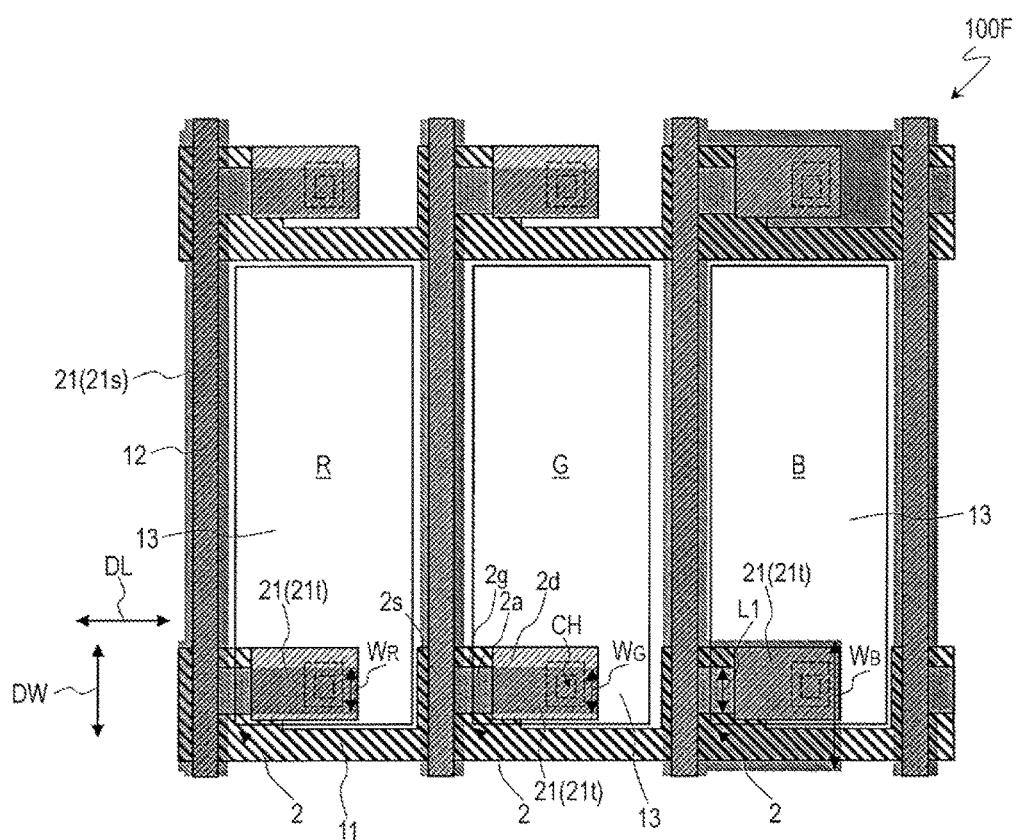
FIG. 11 A plan view schematically showing a liquid crystal display device 100F according to an embodiment of the present invention.

FIG. 11 shows another liquid crystal display device 100F of the present embodiment. FIG. 11 is a plan view schematically showing the liquid crystal display device 100F.

In the liquid crystal display device 100A of Embodiment 1, the TFT shading portion 21t of each pixel includes a portion thereof that does not overlap with the TFT 2 (a portion that is on the right side with respect to the contact hole CH or the drain electrode 2d), as shown in FIGS. 1(a) and 1(b). In contrast, in the liquid crystal display device 100F shown in FIG. 11, the TFT shading portion 21t of each pixel does not include a portion that does not overlap with the TFT 2 (a portion that is on the right side with respect to the contact hole CH or the drain electrode 2d). Therefore, it is possible to further improve the aperture ratio.

Note that there is no particular limitation on the widths $W_R$ and $W_G$ of the TFT shading portions 21t in the red pixel R and the green pixel G as long as they are less than or equal to the length L1 (i.e., 100% or less of the length L1) of the oxide semiconductor layer 2a along the channel width direction DW. In view of improving the aperture ratio, they are preferably as small as possible, and specifically, they are preferably 50% or less of the length L1 of the oxide semiconductor layer 2a along the channel width direction DW.

Figure 12:
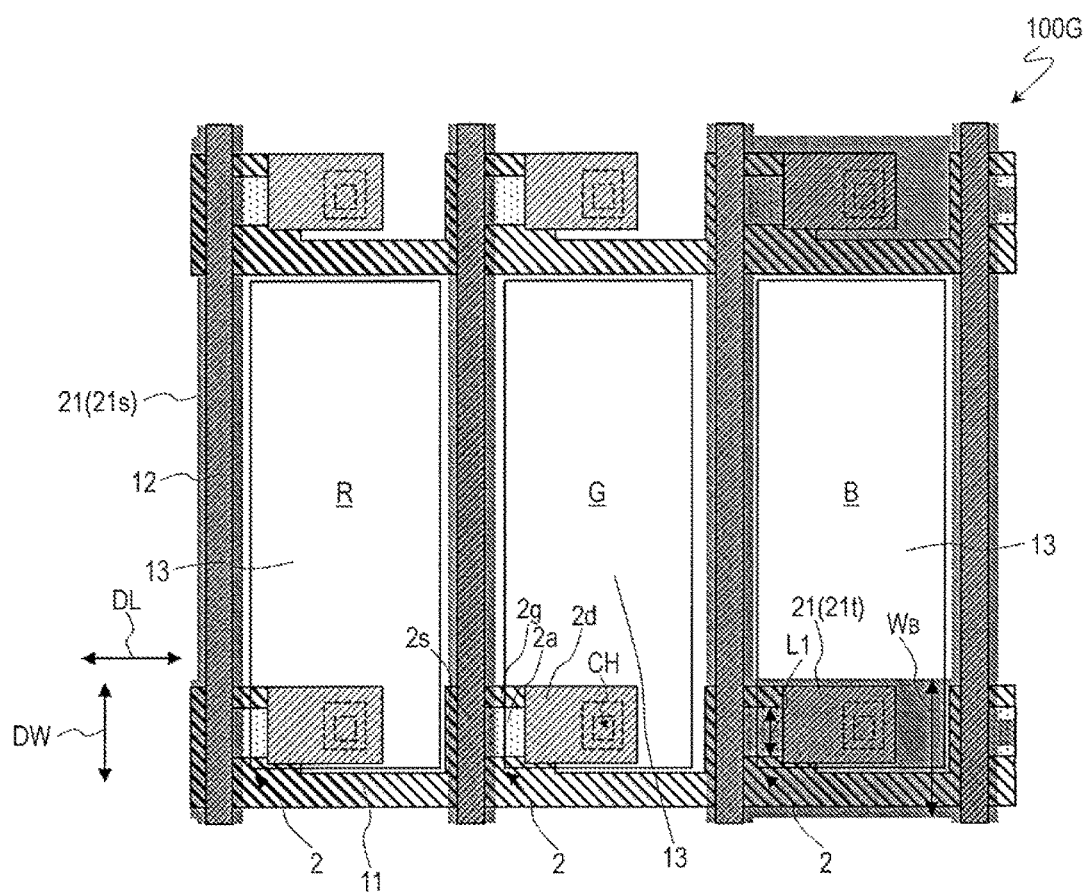
FIG. 12 A plan view schematically showing a liquid crystal display device 100G according to an embodiment of the present invention.

The widths $W_R$ and $W_G$ of the TFT shading portions 21t in the red pixel R and the green pixel G may be zero. That is, as in the liquid crystal display device 100G shown in FIG. 12, the light blocking layer 21 may have no TFT shading portion 21t in the red pixel R and the green pixel G.

Embodiment 5

Figure 13:
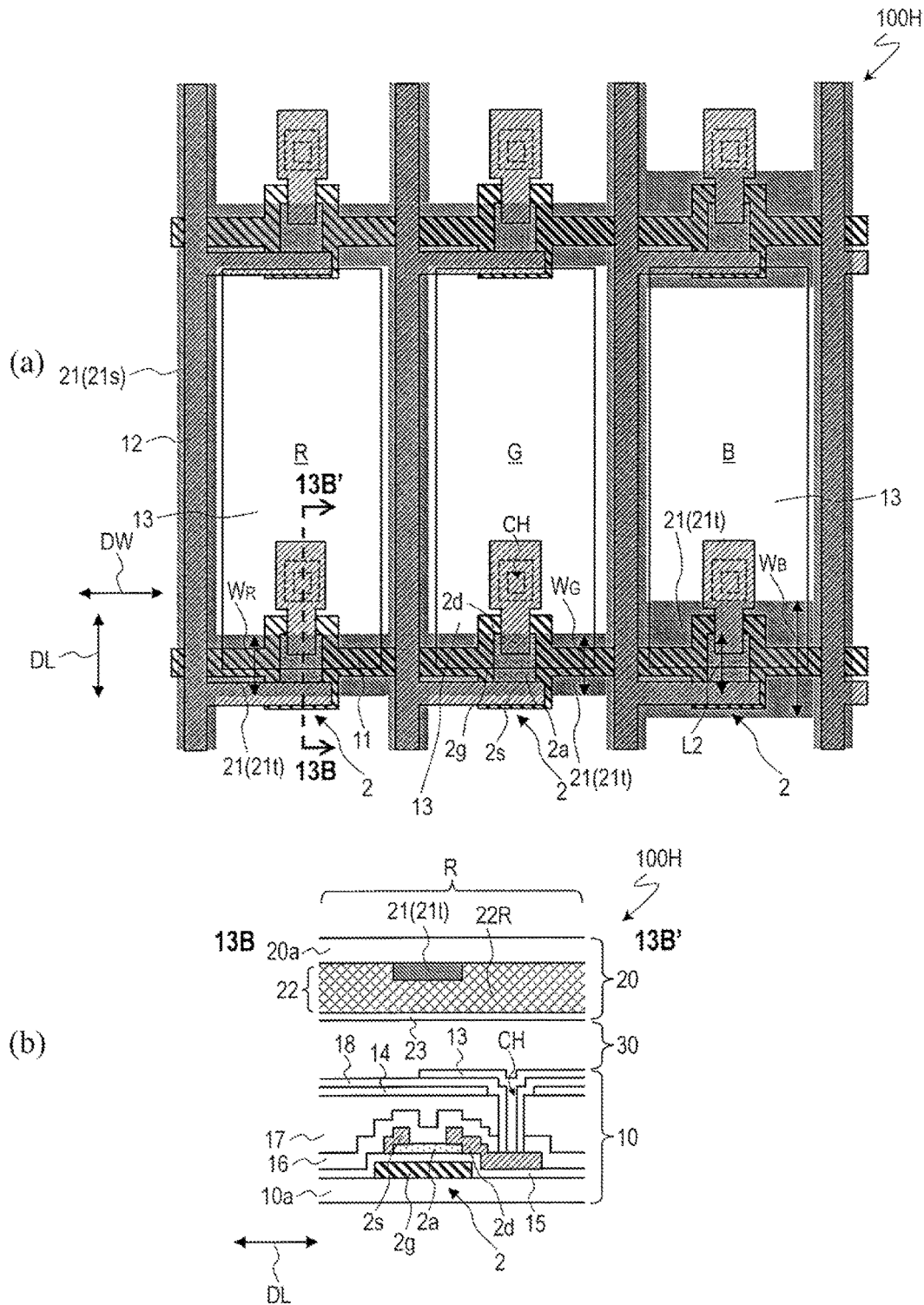
FIG. 13(a) is a plan view schematically showing a liquid crystal display device 100H according to an embodiment of the present invention, and (b) is a cross-sectional view taken along line 13B-13B' of (a).

FIGS. 13(a) and 13(b) show a liquid crystal display device 100H of the present embodiment. FIG. 13(a) is a plan view schematically showing the liquid crystal display device 100H, and FIG. 13(b) is a cross-sectional view taken along line 13B-13B' of FIG. 13(a). The description below will focus on differences between the liquid crystal display device 100H of the present embodiment and the liquid crystal display device 100A of Embodiment 1.

In the liquid crystal display device 100A of Embodiment 1, the arrangement of the TFT 2 is a horizontal arrangement. That is, the channel length direction DL is parallel to the row direction, and the source region 2as, the channel region 2ac and the drain region 2ad are arranged along the row direction.

In contrast, in the liquid crystal display device 100H of the present embodiment, the channel length direction DL is parallel to the column direction, and the source region 2as, the channel region 2ac and the drain region 2ad are arranged along the column direction, as shown in FIGS. 13(a) and 13(b). In the present embodiment, such an arrangement of the TFT 2 is referred to as the "vertical arrangement".

In the present embodiment, the TFT shading portion 21t of the light blocking layer 21 extends along the row direction, as does the TFT shading portion 21t of the liquid crystal display device 100A of Embodiment 1. Note however that the arrangement of the TFT 2 is a horizontal arrangement in the liquid crystal display device 100A of Embodiment 1, whereas the arrangement of the TFT 2 is a vertical arrangement in the liquid crystal display device 100H of the present embodiment. Therefore, the TFT shading portion 21t of the present embodiment extends along the channel width direction DW.

In the liquid crystal display device 100H of the present embodiment, the blue color filter 22B has an average transmittance greater than 0.2% for visible light having a wavelength of 450 nm or less. In contrast, the red color filter 22R and the green color filter 22G each have an average transmittance of 0.2% or less for visible light having a wavelength of 450 nm or less.

The TFT shading portion 21t of the light blocking layer 21 in the blue pixel B has the width $W_B$ greater than the length L2 of the oxide semiconductor layer 2a along the channel length direction DL. In contrast, the TFT shading portions 21t in the red pixel R and the green pixel G have the width $W_R$ and the width $W_G$, respectively, which are less than or equal to the length L2 of the oxide semiconductor layer 2a along the channel length direction DL.

Also with the liquid crystal display device 100H of the present embodiment, for the same reason as that with the liquid crystal display device 100A of Embodiment 1, it is possible to improve the aperture ratio without detracting from the reliability of the TFT 2, which is an oxide semiconductor TFT.

Note that the width $W_R$ of the TFT shading portion 21t in the red pixel R and the width $W_G$ of the TFT shading portion 21t in the green pixel G may be equal to each other or may be different from each other. There is no particular limitation on the widths $W_R$ and $W_G$ of the TFT shading portions 21t in the red pixel R and the green pixel G as long as they are less than or equal to the length L2 (i.e., 100% or less of the length L2) of the oxide semiconductor layer 2a along the channel length direction DL. In view of improving the aperture ratio, they are preferably as small as possible, and specifically, they are preferably 50% or less of the length L2 of the oxide semiconductor layer 2a along the channel length direction DL.

The widths $W_R$ and $W_G$ of the TFT shading portions 21t in the red pixel R and the green pixel G may be zero. That is, the light blocking layer 21 may have no TFT shading portion 21t in the red pixel R and the green pixel G.

Note that Embodiments 1 to 5 described above are directed to cases in which the red color filter 22R and the green color filter 22G both have an average transmittance of 0.2% or less for visible light having a wavelength of 450 nm or less, but the embodiments of the present invention are not limited thereto. Either one of the red color filter 22R and the green color filter 22G may have an average transmittance of 0.2% or less for visible light having a wavelength of 450 nm or less, in which case the width of the TFT shading portion 21t may be made narrower than those in the prior art in pixels provided with a color filter having an average transmittance of 0.2% or less for visible light having a wavelength of 450 nm or less (specifically, it may be less than or equal to the length L1 of the oxide semiconductor layer 2a along the channel width direction DW when the TFT shading portion 21t extends along the channel length direction DL, and it may be less than or equal to the length L2 of the oxide semiconductor layer 2a along the channel length direction DL when the TFT shading portion 21t extends along the channel width direction DW).

Embodiments 1 to 5 described above are directed to cases in which the color filter layer 22 includes the red color filter 22R, the green color filter 22G and the blue color filter 22B, but the embodiments of the present invention are not limited thereto. The color filter layer 22 may include a color filter that allows light of another color to pass therethrough, in addition to the red color filter 22R, the green color filter 22G and the blue color filter 22B (or instead of at least one of the red color filter 22R, the green color filter 22G and the blue color filter 22B). For example, the color filter layer 22 may include a yellow color filter that allows yellow light to pass therethrough, in addition to the red color filter 22R, the green color filter 22G and the blue color filter 22B. A yellow color filter is provided in yellow pixels that display yellow.

When the color filter layer 22 includes a yellow color filter, it is possible to realize the effect of improving the aperture ratio of the yellow pixels by setting the average transmittance of the yellow color filter for visible light having a wavelength of 450 nm or less to be 0.2% or less and making the width of the TFT shading portion 21t in the yellow pixels narrower than those in the prior art (specifically, by making it less than or equal to the length L1 of the oxide semiconductor layer 2a along the channel width direction DW when the TFT shading portion 21t extends along the channel length direction DL, or by making it less than or equal to the length L2 of the oxide semiconductor layer 2a along the channel length direction DL when the TFT shading portion 21t extends along the channel width direction DW).

As understood from the above description, a display device according to an embodiment of the present invention is capable of improving the aperture ratio by employing both of the following configurations [1] and [2].

[1] At least one of a first color filter, a second color filter and a third color filter that allow light of different colors pass therethrough has an average transmittance of 0.2% or less for visible light having a wavelength of 450 nm or less.

[2] In pixels provided with color filters that have an average transmittance of 0.2% or less for visible light having a wavelength of 450 nm or less, the light blocking layer (a) includes a TFT shading portion extending along the channel length direction and shading at least a portion of the TFT, the TFT shading portion having a width that is less than or equal to the length of the oxide semiconductor layer along the channel width direction; or (b) includes a TFT shading portion extending along the channel width direction and shading at least a portion of the TFT, the TFT shading portion having a width that is less than or equal to the length of the oxide semiconductor layer along the channel length direction; or (c) includes no TFT shading portion that shades at least a portion of the TFT.

While Embodiments 1 to 5 described above illustrate liquid crystal display devices, embodiments of the present invention are not limited to liquid crystal display devices. A display device according to an embodiment of the present invention may be an organic EL display device 100I as shown in FIG. 14, for example.

Figure 14:
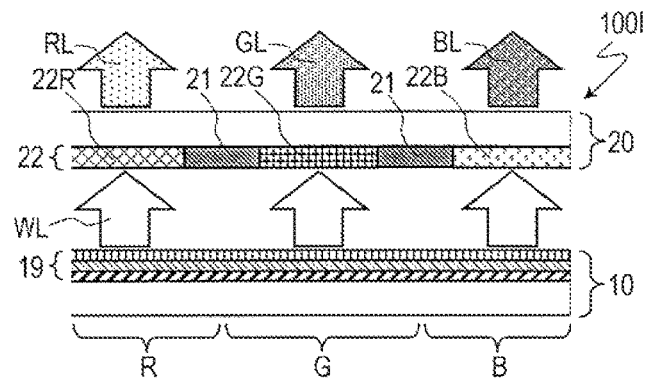
FIG. 14 A cross-sectional view schematically showing an organic EL display device 100I according to an embodiment of the present invention.

The organic EL display device 100I includes the TFT substrate 10 and the counter substrate 20 opposing the TFT substrate 10, as shown in FIG. 14.

The TFT substrate 10 includes a TFT (not shown) provided in each pixel, and an organic EL layer 19 that emits white light WL.

The counter substrate 20 includes the light blocking layer 21 and the color filter layer 22. The color filter layer 22 includes the red color filter 22R, the green color filter 22G and the blue color filter 22B.

As white light WL emitted from the organic EL layer 19 passes through the red color filter 22R, the green color filter 22G or the blue color filter 22B, thereby emitting red light RL from the red pixel R, green light GL from the green pixel G, and blue light BL from the blue pixel B.

The organic EL display device 100I is also capable of improving the aperture ratio by employing both of the configurations [1] and [2] above.

Embodiment 6

Figure 15:
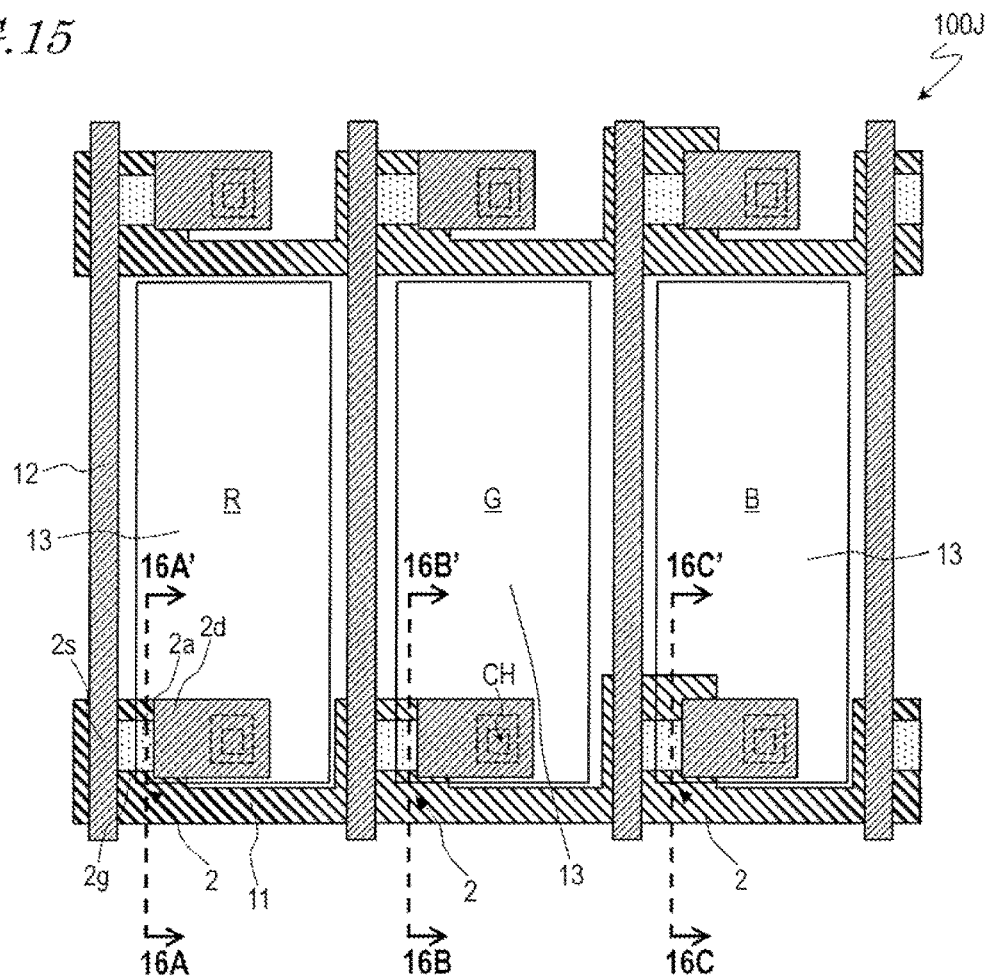
FIG. 15 A plan view schematically showing a liquid crystal display device 100J according to an embodiment of the present invention.
Figure 16:
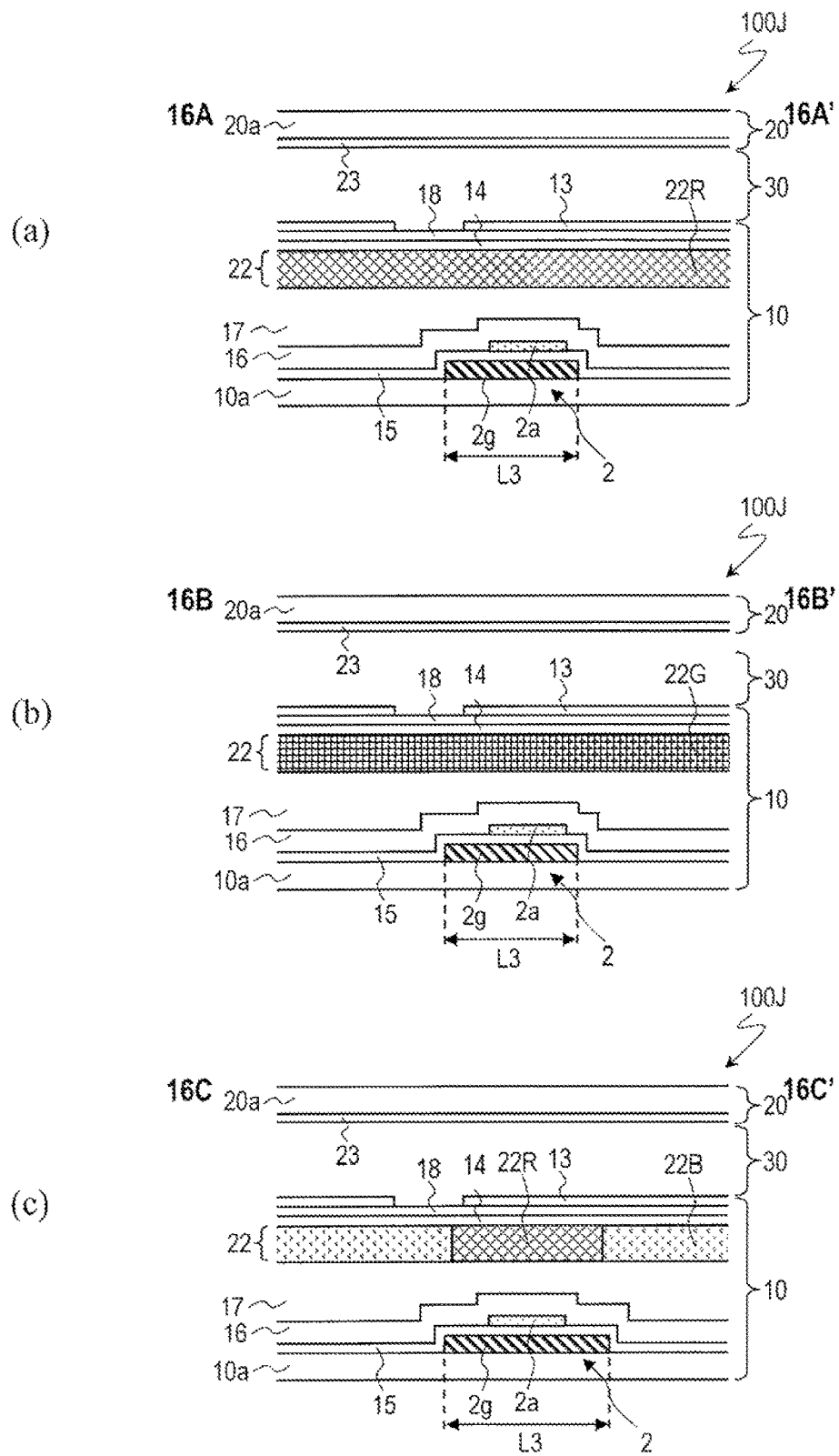
FIGS. 16(a), (b) and (c) are cross-sectional views taken along line 16A-16A', line 16B-16B' and line 16C-16C', respectively, of FIG. 15.

FIG. 15 and FIGS. 16(a), 16(b) and 16(c) show a liquid crystal display device 100J of the present embodiment. FIG. 15 is a plan view schematically showing the liquid crystal display device 100J, FIGS. 16(a), 16(b) and 16(c) are cross-sectional views taken along line 16A-16A', line 16B-16B' and line 16C-16C', respectively, of FIG. 15. The description below will focus on differences between the liquid crystal display device 100J of the present embodiment and the liquid crystal display device 100A of Embodiment 1.

In the liquid crystal display device 100A of Embodiment 1, the counter substrate 20 includes the color filter layer 22. In contrast, in the liquid crystal display device 100J of the present embodiment, the TFT substrate 10 includes the color filter layer 22, as shown in FIGS. 16(a), 16(b) and 16(c). That is, a color filter-on-array structure is employed. Specifically, the color filter layer 22 including the red color filter 22R, the green color filter 22G and the blue color filter 22B is formed on the organic insulating layer 17, the storage capacitor counter electrode 14, the dielectric layer 18 and the pixel electrode 13 are provided in this order on the color filter layer 22. In the liquid crystal display device 100J of the present embodiment, the counter substrate 20 does not include a light blocking layer.

In the red pixel R, the red color filter 22R is arranged so as to overlap with the TFT 2 as shown in FIG. 16(a). In the green pixel G, the green color filter 22G is arranged so as to overlap with the TFT 2 as shown in FIG. 16(b). Moreover, in the blue pixel B, the red color filter 22R (or the green color filter 22G) is arranged so as to overlap with the TFT 2 as shown in FIG. 16(c).

In the liquid crystal display device 100J of the present embodiment, a color filter having an average transmittance of 0.2% or less for visible light having a wavelength of 450 nm or less (the red color filter 22R or the green color filter 22G) is arranged so as to overlap with the TFT 2 of each pixel. Therefore, even if the light blocking layer on the side of the counter substrate 20 is omitted, it is possible to suppress the lowering of the reliability of the TFT 2, and it is thus possible to improve the aperture ratio.

Note that the red color filter 22R provided in the blue pixel B is preferably formed to be slightly large so that a portion of the TFT 2 will not lie on the outside of the red color filter 22R due to misalignment, or the like. The region in the blue pixel B in which the red color filter 22R is provided is preferably not used for producing display, and the region is preferably shaded by means of the gate electrode 2g, or the like. With the configuration illustrated in FIG. 15 and FIGS. 16(a), 16(b) and 16(c), the length L3 of the gate electrode 2g in the blue pixel B along the column direction is larger than the length L3 of the gate electrode 2g in the red pixel R and the green pixel G along the column direction, thereby shading the entire region where the red color filter 22R is provided.

Figure 17:
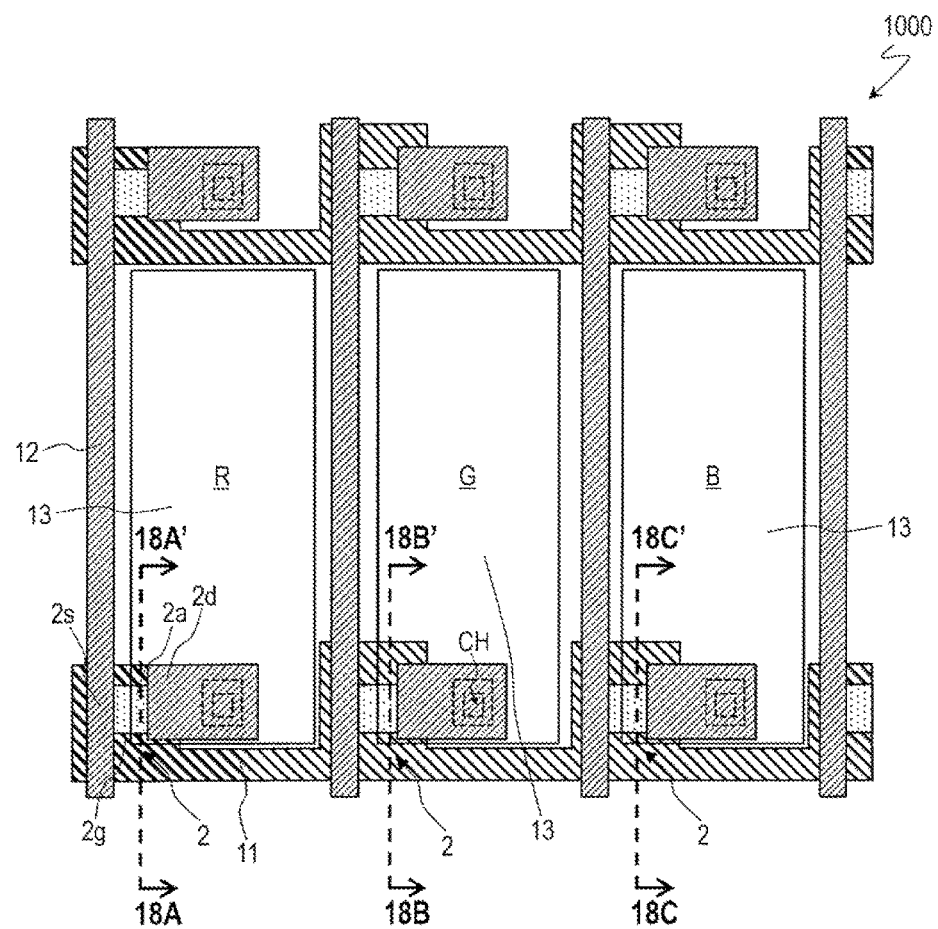
FIG. 17 A plan view schematically showing a liquid crystal display device 1000 according to a reference example.

Note that one may possibly employ a configuration in which the TFTs 2 of the red pixel R, the green pixel G and the blue pixel B are all shaded by means of color filters of the same color (e.g., the red color filters 22R). FIG. 17 and FIGS. 18(a), 18(b) and 18(c) show a liquid crystal display device 1000 of a reference example having such a configuration. FIG. 17 is a plan view schematically showing the liquid crystal display device 1000, and FIGS. 18(a), 18(b)

and 18(c) are cross-sectional views taken along line 18A-18A', line 18B-18B' and line 18C-18C', respectively, of FIG. 17.

Figure 18:
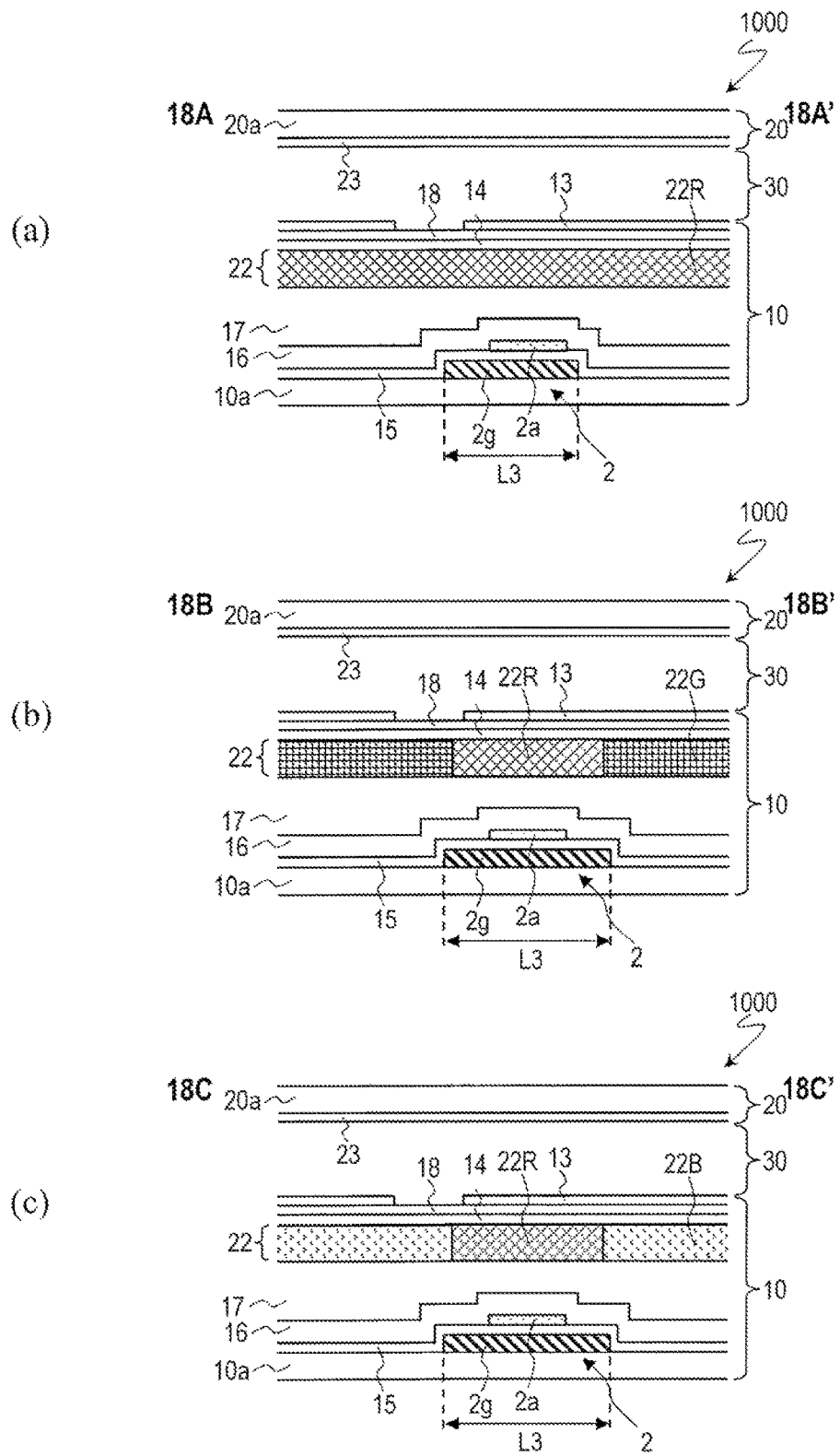
FIGS. 18(a), (b) and (c) are cross-sectional views taken along line 13A-18A', line 18B-18B' and line 18C-18C', respectively, of FIG. 17.

In the liquid crystal display device 1000 of the reference example, the red color filter 22R is arranged so as to overlap with the TFT 2 in all of the red pixel R, the green pixel G and the blue pixel B, as shown in FIGS. 18(a), 18(b) and 18(c).

Also in the liquid crystal display device 1000 of the reference example, the light blocking layer on the side of the counter substrate 20 may be omitted. However, with the liquid crystal display device 1000 of the reference example, there is a need to shade the region where the red color filter 22R is provided not only for the blue pixel B but also for the green pixel G, and thus, the length L3 of the gate electrode 2g in the green pixel G along the column direction is larger than the length L3 of the gate electrode 2g in the red pixel R along the column direction. Therefore, the aperture ratio will be lowered as compared with the liquid crystal display device 100J of the present embodiment.

INDUSTRIAL APPLICABILITY

According to an embodiment of the present invention, it is possible to improve the aperture ratio of a display device having oxide semiconductor TFTs. The embodiments of the present invention are widely applicable to display devices including oxide semiconductor TFTs and color filters.

REFERENCE SIGNS LIST

2 TFT (thin film transistor)
2a Oxide semiconductor layer
2ac Channel region
2as Source region
2ad Drain region
2g Gate electrode
2s Source electrode
2d Drain electrode
10 TFT substrate (first substrate)
10a Transparent substrate
11 Scanning line
12 Signal line
13 Pixel electrode
13a Slits of pixel electrode
14 Storage capacitor counter electrode (common electrode)
14a Region where conductive film of common electrode is removed
14b Slits of common electrode
15 Gate insulating layer
16 Inorganic insulating layer
17 Organic insulating layer
18 Dielectric layer
19 Organic EL layer
20 Counter substrate (second substrate)
20a Transparent substrate
21 Light blocking layer (black matrix)
21s First portion of light blocking layer
21t Second portion (TFT shading portion) of light blocking layer
22 Color filter layer
22R Red color filter
22G Green color filter
22B Blue color filter
23 Counter electrode
30 Liquid crystal layer
100A, 100B, 100C, 100D, 100E Liquid crystal display device
100F, 100G, 100H, 100J Liquid crystal display device
100I Organic EL display device
CH Contact hole
R Red pixel
G Green pixel
B Blue pixel
DL Channel length direction
DW Channel width direction

The invention claimed is:

1. A display device comprising:
a first substrate, and a second substrate provided so as to oppose the first substrate; and
a plurality of pixels arranged in a matrix pattern, wherein:
the first substrate includes a TFT provided for each of the plurality of pixels, the TFT including an oxide semiconductor layer including a channel region, a source region and a drain region;
the second substrate includes a color filter layer and a light blocking layer;
the color filter layer includes a first color filter, a second color filter and a third color filter that allow light of different colors to pass therethrough;
at least one of the first color filter, the second color filter and the third color filter has an average transmittance of 0.2% or less for visible light having a wavelength of 450 nm or less;
in pixels provided with color filters having the average transmittance of 0.2% or less for visible light having the wavelength of 450 nm or less, the light blocking layer (a) includes a TFT shading portion extending along a channel length direction and shading at least a portion of the TFT, the TFT shading portion having a width that is less than or equal to a length of the oxide semiconductor layer along a channel width direction; or
(b) includes a TFT shading portion extending along the channel width direction and shading at least a portion of the TFT, the TFT shading portion having a width that is less than or equal to the length of the oxide semiconductor layer along the channel length direction; or
(c) includes no TFT shading portion that shades at least a portion of the TFT;
the plurality of pixels include a red pixel displaying red, a green pixel displaying green, and a blue pixel displaying blue;
the first color filter, the second color filter and the third color filter are a red color filter that allows red light to pass therethrough, a green color filter that allows green light to pass therethrough, and a blue color filter that allows blue light to pass therethrough, respectively;
the blue color filter has an average transmittance greater than 0.2% for visible light having the wavelength of 450 nm or less;
in the blue pixel, the light blocking layer includes a TFT shading portion extending along the channel length direction and shading the TFT, the TFT shading portion having a width that is greater than the length of the oxide semiconductor layer along the channel width direction;
the red color filter and the green color filter each have the average transmittance of 0.2% or less for visible light having the wavelength of 450 nm or less;
in each of the red pixel and the green pixel, the light blocking layer either includes a TFT shading portion extending along the channel length direction, shading at least a portion of the TFT and having a width that is less than or equal to the length of the oxide semiconductor layer along the channel width direction, an area of the TFT shading portion in each of the red pixel and the green pixel being smaller than an area of the TFT shading portion in the blue pixel;

the width of the TFT shading portion in the blue pixel is substantially constant along the channel length direction;

in each of the red pixel and the green pixel, the light blocking layer includes the TFT shading portion;

the width of the TFT shading portion in the red pixel is substantially constant along the channel length direction; and the width of the TFT shading portion in the green pixel is substantially constant along the channel length direction.

2. The display device according to claim 1, wherein:
a width of the TFT shading portion in the red pixel is equal to a width of the TFT shading portion in the green pixel.

3. The display device according to claim 1, wherein:
a width of the TFT shading portion in the red pixel is smaller than a width of the TFT shading portion in the green pixel.

4. The display device according to claim 1, wherein:
a width of the TFT shading portion in the green pixel is smaller than a width of the TFT shading portion in the red pixel.

5. The display device according to claim 1, wherein the oxide semiconductor layer includes an In—Ga—Zn—O-based semiconductor.

6. The display device according to claim 5, wherein the In—Ga—Zn—O-based semiconductor includes a crystalline portion.

7. The display device according to claim 1, further comprising a liquid crystal layer provided between the first substrate and the second substrate.

8. The display device, wherein:
a first substrate, and a second substrate provided so as to oppose the first substrate; and
a plurality of pixels arranged in a matrix pattern, wherein:
the first substrate includes a TFT provided for each of the plurality of pixels, the TFT including an oxide semiconductor layer including a channel region, a source region and a drain region;
the second substrate includes a color filter layer and a light blocking layer;
the color filter layer includes a first color filter, a second color filter and a third color filter that allow light of different colors to pass therethrough;
at least one of the first color filter, the second color filter and the third color filter has an average transmittance of 0.2% or less for visible light having a wavelength of 450 nm or less;
in pixels provided with color filters having the average transmittance of 0.2% or less for visible light having the wavelength of 450 nm or less, the light blocking layer (a) includes a TFT shading portion extending along a channel length direction and shading at least a portion of the TFT, the TFT shading portion having a width that is less than or equal to a length of the oxide semiconductor layer along a channel width direction; or
(b) includes a TFT shading portion extending along the channel width direction and shading at least a portion of the TFT, the TFT shading portion having a width that is less than or equal to the length of the oxide semiconductor layer along the channel length direction; or
(c) includes no TFT shading portion that shades at least a portion of the TFT;
the plurality of pixels include a red pixel displaying red, a green pixel displaying green, and a blue pixel displaying blue;
the first color filter, the second color filter and the third color filter are a red color filter that allows red light to pass therethrough, a green color filter that allows green light to pass therethrough, and a blue color filter that allows blue light to pass therethrough, respectively;
the blue color filter has an average transmittance greater than 0.2% for visible light having the wavelength of 450 nm or less;
in the blue pixel, the light blocking layer includes a TFT shading portion extending along the channel width direction and shading the TFT, the TFT shading portion having a width that is greater than the length of the oxide semiconductor layer along the channel length direction;
the red color filter and the green color filter each have the average transmittance of 0.2% or less for visible light having the wavelength of 450 nm or less;
in each of the red pixel and the green pixel, the light blocking layer either includes a TFT shading portion extending along the channel width direction, shading at least a portion of the TFT and having a width that is less than or equal to the length of the oxide semiconductor layer along the channel length direction, an area of the TFT shading portion in each of the red pixel and the green pixel being smaller than an area of the TFT shading portion in the blue pixel;
the width of the TFT shading portion in the blue pixel is substantially constant along the channel width direction;
in each of the red pixel and the green pixel, the light blocking layer includes the TFT shading portion;
the width of the TFT shading portion in the red pixel is substantially constant along the channel width direction; and
the width of the TFT shading portion in the green pixel is substantially constant along the channel width direction.

9. The display device according to claim 8, wherein:
a width of the TFT shading portion in the red pixel is equal to a width of the TFT shading portion in the green pixel.

10. The display device according to claim 8, wherein:
a width of the TFT shading portion in the red pixel is smaller than a width of the TFT shading portion in the green pixel.

11. The display device according to claim 8, wherein:
a width of the TFT shading portion in the green pixel is smaller than a width of the TFT shading portion in the red pixel.

* * * * *